(12) United States Patent
Blancha et al.

(10) Patent No.: US 7,869,986 B2
(45) Date of Patent: Jan. 11, 2011

(54) SYSTEM AND METHOD FOR PERFORMING PROCESSING IN A TESTING SYSTEM

(76) Inventors: Barry E. Blancha, 245 Burroughs Rd., Boxborough, MA (US) 01719; Leszek Janusz Lechowicz, 1755 Plymouth St., Bridgewater, MA (US) 02324; Stephen S. Helm, 85 Silver Leaf Way, #34, Marlborough, MA (US) 01752; Sean Patrick Adam, 385 Creek St., Wrentham, MA (US) 02093; Jorge Camargo, 14 Lynwood La., Westford, MA (US) 01886; Carlos Heil, 19 Harrow Rd., Norwood, MA (US) 02062; Paulo Mendes, 42 Chestnut St., Hopkinton, MA (US) 01748

( * ) Notice: Subject to any disclaimer, the term of this patent is extended or adjusted under 35 U.S.C. 154(b) by 720 days.

(21) Appl. No.: 11/827,090

(22) Filed: Jul. 10, 2007

(65) Prior Publication Data

US 2008/0040641 A1 Feb. 14, 2008

Related U.S. Application Data

(60) Provisional application No. 60/819,610, filed on Jul. 10, 2006, provisional application No. 60/819,762, filed on Jul. 10, 2006.

(51) Int. Cl.
*G06F 9/455* (2006.01)
*H04L 7/00* (2006.01)
(52) U.S. Cl. ................ 703/22; 703/23; 702/189; 717/128; 717/149; 455/67.11
(58) Field of Classification Search ............... 703/22, 703/23; 702/189, 183; 717/128, 149; 455/67.11, 455/87.11
See application file for complete search history.

(56) References Cited

U.S. PATENT DOCUMENTS 6,587,671 B1 * 7/2003 Kanago et al. ........... 455/67.11
7,200,529 B2 * 4/2007 Cifra et al. .................. 702/189

(Continued)

*Primary Examiner*—Thai Phan

(57) ABSTRACT

A system and method is provided for performing processing in a test system. A flexible platform may be provided for developing test programs for performing automated testing. In one such platform, the tester and its instruments are isolated from the tester operating system, permitting any tester operating system to be used. In another example implementation, a user layer of the platform is isolated from the physical layer of the architecture, permitting hardware-independent test programs that can be created and used among different testers having different test hardware and software. In yet another implementation, execution of a test program is isolated from a tester platform operating system, permitting the test program to function independent from the tester platform. In another embodiment, functionality is implemented on the platform such that functions are only added, and that existing links to functions are not broken, ensuring continued test system operation when new software, hardware and/or features are added to the platform. The test system may include a non-deterministic computer system. In one example test system, the system forces execution of one or more computer instructions performed by the non-deterministic computer system to execute within a constant execution time. A deterministic engine, if necessary, waits a variable amount of time to ensure that the execution of the computer instructions is performed over the constant execution time. Because the execution time is constant, the execution is deterministic and therefore may be used in applications requiring deterministic behavior. For example, such a deterministic engine may be used in automated test equipment (ATE) applications.

56 Claims, 21 Drawing Sheets

U.S. PATENT DOCUMENTS

| | | |
|---|---|---|
| 2002/0109722 A1 | 8/2002 | Rogers et al. |
| 2002/0166000 A1 | 11/2002 | Rossi et al. |
| 2003/0056200 A1* | 3/2003 | Li et al. .................. 717/128 |
| 2004/0103391 A1 | 5/2004 | Wu et al. |
| 2004/0225465 A1 | 11/2004 | Pramanick et al. |
| 2006/0195744 A1 | 8/2006 | Petersen |
| 2006/0241929 A1* | 10/2006 | Ferris ..................... 703/23 |
| 2007/0124451 A1* | 5/2007 | Joshi et al. ............... 709/223 |
| 2007/0169042 A1* | 7/2007 | Janczewski ............... 717/149 |
| 2009/0119088 A1* | 5/2009 | Ferris ..................... 703/23 |

* cited by examiner

SYSTEM AND METHOD FOR PERFORMING PROCESSING IN A TESTING SYSTEM

REFERENCE TO RELATED APPLICATIONS

This application claims priority under 35 U.S.C. §119(e) to U.S. Provisional Application Ser. No. 60/819,610, entitled "SYSTEM AND METHOD FOR PERFORMING PROCESSING IN A TESTING SYSTEM," filed Jul. 10, 2006, and to U.S. Provisional Application Ser. No. 60/819,762, entitled "SYSTEM AND METHOD FOR PROCESSING IN A TEST SYSTEM," filed Jul. 10, 2006, each of which applications are incorporated by reference in their entirety.

BACKGROUND OF THE INVENTION

1. Field of the Invention

The invention relates generally to test systems, and more specifically, to test systems in the automatic test equipment (ATE) area.

2. Discussion of the Related Art

Today, most test equipment in the ATE area involves one or more computer systems. A computer system that implements testing steps must be reliable and must generate test steps in a deterministic way. That is, the computer systems must be capable of producing consistent results. One problem with such a computer is cost—design of a complete computing system suitable for use in testing (e.g., one that produces consistent results) requires not only the expensive hardware design and maintenance but also expensive software design involving operating system, user interface, drivers, tools, etc. More particularly, deterministic execution can be achieved using expensive computing hardware and software and/or distributed hardware within the tester, such as individual control processors within the instrument or other testing resource. As a result, computer systems suitable for ATE are prohibitively expensive for most companies to purchase and maintain.

Automated test equipment (ATE) is computer-controlled equipment that tests electronic devices for functionality and performance. ATE devices also conduct stress testing with minimal human interaction. A typical ATE tester includes control hardware, sensors, and software that collects and analyzes the test results. Such an ATE tester relies on particular test instruments to perform the testing and return results to the control software. Conventional ATE testers and methodologies are widely considered to only be cost efficient for high-volume testing.

This widely held belief stems, in part, from the design and operation of conventional ATE testers. As it stands now, a manufacturer can create a new device or system. A key element in the design and construction of any new device or system is the ability to test the device or system for quality, functionality, and serviceability. The first step in testing that new device is to determine if anyone already has a tester designed and working that may cover the new device. If one does not exist, the only option is to have a suitable tester built. The current marketplace takes a long time to determine if a new tester should be built, let alone to begin actual construction of such a tester. Determining whether or not a new tester covering the new device would have wide demand, or any at all beyond the single use, ultimately determines whether the new tester will be made. If it does not, that often ends the possibility of getting a new tester. If it does, the new tester still must be designed and fabricated. An average time for completing such a process is on the order of years. For instance, it is not uncommon for it to take two or more years to produce a new tester. In that time frame, most manufacturers are already looking to test a newer device, so such tester may be obsolete even before it is released.

SUMMARY OF THE INVENTION

According to one aspect of the present invention, it is appreciated that such ATE systems are expensive due to the fact that they are specially-developed systems that have limited applications, among other reasons. Because they are highly specialized, they do not lend themselves to be mass-produced, or include mass-produced hardware and software components. In one aspect of the invention, it is appreciated that it would be beneficial to produce an ATE system using less expensive, more general-purpose components.

Further, according to one aspect of the present invention, it is appreciated that the total cost of ATE systems are expensive due primarily to the tight coupling between software and hardware. More specifically, components of the ATE system such as the operating systems, test platforms, their associated applications, and underlying test hardware depend on each other, and when one of these components are changed, the ATE system may not function in the same manner prior to the change. In a deterministic system such as an ATE system, such a change may cause a test program to perform differently, producing non-deterministic test results.

Practically, in a production test environment, this results in user (e.g., test engineers) being reluctant to implement new features in existing production test systems. For instance, if a new software-based test function is made available in an existing test system, introduction of that new software may break the operation of the current software. For instance, if a software driver is replaced by a later-version driver, the test system may not function in the same way, and test results may be affected. Similarly, if an improved hardware (e.g., a test instrument) is added to an existing ATE system, the hardware and/or software of the existing system may not function in the same way or at all. As a result, test engineers generally do not disturb existing test systems to implement new functionality, but rather would purchase new hardware and software for performing new test functions. This results in inefficient use of testing resources, and limited reuse of testing platforms. Further, the test hardware and software producer must rigorously test all possible permutations of components to prohibit problems from occurring in the field, thus increasing production costs and the overall cost of the test equipment.

Further, test engineers may develop their own testing programs that use hardware and software of the ATE. Because their programs use the tightly-coupled hardware and software, their programs are also highly dependent on this tightly-coupled system, and any changes in the underlying system may cause their test programs to operate differently than expected. Because of this, test engineers are generally unwilling to consider new software and/or hardware changes to existing production test environments. Such test equipment may be used, for example, in manufacturing of electronic devices, and a failure of such equipment may impact manufacturing schedules.

According to one aspect of the present invention, a platform is provided that permits components (e.g., hardware, software) to be changed without affecting the operation of other components. For instance, in a test environment, a test development platform may include test system software, software drivers used to communicate with various test instruments, and operating system software. According to one aspect, an architecture is provided that isolates the function of such components to reduce the amount of coupling between the components. In this way, the changing of one component does not affect the operation of other components.

For instance, when adding a component, the addition of the component does not disturb the function of other components. In one specific example, a portion of test hardware (e.g., a test instrument) fails which needs to be replaced. However, only a new version of the test hardware is available. This new version has a different interface than the failed test hardware, and it follows that the software and applications that access the new hardware need to be changed to adapt to the new interface. Unfortunately, this change results in increased maintenance costs for the test system, as all test programs and applications that used the old hardware will need to be changed and retested, as the communication between hardware and software was broken. However, in some cases, the user has no choice, as equipment manufacturers frequently change hardware and software, causing the overall system not to work.

According to one aspect of the present invention, it is appreciated that testing applications and their associated software (e.g., platform OS, drivers) and hardware are tightly coupled. In one embodiment, an abstraction layer is provided that decouples the testing application from hardware. According to one embodiment, a virtual instrument is provided that presents a common interface to a user. The interface, according to one embodiment, does not change when the underlying hardware changes, reducing the possibility that the application will not work when changes are made. Further, it follows that an application developed using the virtual instrument can be used among systems having different hardware types and/or versions, as hardware-specific implementations are, according to one embodiment, abstracted from the application.

In one implementation, a system architecture is provided that is modular, linked by interfaces. In one implementation, modules are linked by add-only interfaces, wherein functionality can be only added to particular interfaces, thereby ensuring that existing code and test programs are not "broken." In another implementation, such interfaces are abstracted to only those functions that are specifically necessary.

Further, according to another aspect of the present invention, it is realized that there is a significant benefit to bringing new automated testing solutions to market faster. In particular, an automated test equipment platform that reduces the time it takes to create a new tester would be beneficial. Further, it is appreciated that it would be beneficial to have the ability to produce testers without requiring wide applicability before fabrication. Moreover, a tester that could incorporate new functionality without requiring the design of a new tester would be beneficial.

A flexible tester that can be fabricated in a shorter time, that is cost efficient, and adaptable to cover new devices will meet the needs of the marketplace. Although, there have been attempts to design such testers, conventional architectures still result in hardware specific code being incorporated with system code making them dependant on specific hardware and rendering them useful in only a narrow range of applications. The interdependence and intermingling of function and software limits conventional ATE testers. Under conventional methodologies any change (additions or subtractions of hardware, and in some cases replacement of identical parts) can result in a tester that does not function properly. Restoring the changed ATE tester to proper function requires additional expenses and increases time to market for the devices to be tested.

The inflexibility of conventional ATE testers increases the costs associated with developing and maintaining testers. With conventional methods, development of new testers generally requires construction from scratch and fails to leverage what is already in place. One aspect of the present invention describes an instrument developer platform defining a set of architecture standards that enable the timely development of new ATE testers that can test a virtually unlimited range of devices. This architecture also allows for the modification of existing testers to include new instrumentation without requiring changes to existing test functionality and its related software. This test system architecture is able to incorporate new instrumentation into an existing tester, and thus leverage what is in place. This is accomplished through the abstraction of sets of functionality in an ATE tester.

In one implementation of the present invention, an instrument incorporated into a particular tester is abstracted into a functional module. This abstracted module manages the functions of the particular instrument while remaining independent of the rest of the ATE tester. In particular, interfaces defined at a platform level allow for independence of the test platform itself. When the functionality of the instrument is employed to test a particular device, the module is called by other independent abstraction layers. The module, independent of the abstraction layer(s) which called it, manages the functions of the instrument and the module returns the results to the that abstraction layer. In this example, the tester interacts with the module only through other independent abstraction layers, the module and its related instrument is permitted to be "plugged-in" to any tester that employs the same architecture. For instance, the module and the related instrument can be removed from one tester and by installing the same module and instrument on another tester (of the same architecture), the functionality of the second tester is enhanced without impacting the existing functions of the second tester. Moreover, in this example, the first tester, from which a module and instrument were extracted, will continue to function with the remaining instruments available to it. Adhering to the architecture standards enables flexibility on existing testers, cost efficiency, and greater speed to completion of new testers.

In another aspect on the present invention, each level of functionality of an ATE tester is abstracted, enabling sets of functions and functionalities to be separated in different layers encompassing the functions of an ATE tester. In one embodiment, users interact with test programs, which bundle visualizations and graphically display results and options from tests performed, or to be performed, on a particular device. For instance, a single test program or multiple programs may be employed by the user to test any particular device or devices. In aspect of the present invention, the abstraction of the functions and functionality provided by test program(s) forms the highest layer of the ATE tester architecture.

Additionally, according to one aspect of the present invention, a system is provided in which virtual instruments can be created and managed. In one embodiment, the virtual instrument being modeled includes behavior that based on the functionality that is desired by the user, rather than hardware-specific implementations. For instance, if a particular function is not natively performed in a software driver, that functionality can be performed in software associated with the virtual instrument. In this way, capabilities of test hardware and their associated drivers may be extended in a standard way. Further, according to another embodiment, because virtual instruments are created from the user perspective, applications are more easily created.

Also, testers and their applications can be created more quickly, as testers are not tied to their hardware. Similarly, hardware associated with a tester can be improved more easily, as software is not so rigidly tied to hardware, and therefore, hardware can be added/changed without affecting software (software will more easily work with hardware). It is appreciated that such a flexible platform for creating and maintaining software and hardware is beneficial to the developer and maintainer of software, and the amount of cost and effort for creating and maintaining testing programs is reduced.

According to another aspect of the present invention, a method for providing software functions is provided that permits compatibility across software and hardware versions. According to one aspect of the present invention, functions of a virtual instrument that refer to hardware functions are unchanged from version to version. More particularly, as functions are added to the virtual instrument, old functions are maintained, and functionality is added to a predetermined memory structure. Functionality to software modules are added without changing references of preexisting functions in memory. Because function references are unchanged, additional functionality, when added to the memory structure does not "break" existing connections. Thus, when a test program is created, the program's functionality is frozen in time, as the functions that the test program accesses remain unchanged going forward, unless the user decides to change the test program. In this way, development and maintenance costs for creating and maintaining test programs is significantly reduced.

According to one embodiment of the present invention, a virtual function table (e.g., in the C++ programming language, the well-known virtual method table ("vtable")) is maintained for a virtual instrument. In one embodiment, in one version of the virtual instrument vtable, a base set of functionality is included having a defined location in the vtable. In a subsequent version of the virtual instrument table, additional functions are added to the vtable, while maintaining the same location in the vtable for the base set of functionality. In this way, functions and their connections to other software are maintained without breaking existing programs when additional functions are added.

According to another embodiment of the present invention, what is referred to herein as a virtual multisite instrument is provided that facilitates management of multiple testing sites. In a traditional testing environment, it is appreciated that a site is managed as a singular entity in that if a particular testing site is configured, a test program is developed for the particular site, specific to the particular testing hardware used. If multiple sites are needed to perform additional testing (e.g., to satisfy an increased testing capacity), then additional test hardware configurations are purchased, and the test program is matriculated to the additional sites. According to one aspect of the present invention, because details of the underlying hardware is abstracted from test programs via an abstraction layer (e.g., a virtual instrument layer), test programs can be managed independent of test hardware, and the abstraction layer may be capable of managing the administration of a test program to multiple sites via the abstraction layer. In one embodiment, the virtual instrument may have capability to map to multiple instrument sites. In this way, the time needed to maintain and administer test programs to multiple sites is reduced.

According to another aspect of the present invention, it is appreciated that test programs software is used by different types of users—some users develop test applications, and others use the developed applications for the administration and management of test processes. However, these separate types of users may need to use a specific user interface (UI), depending on what functions are performed. It is appreciated that multiple types of testers have different user interfaces, forcing the user to understand the specific type of interface necessary to run the equipment. Also, it is appreciated that in the ATE industry, the application and drivers are tightly coupled, and the user interfaces are tied to the system software. According to one aspect of the present invention, a standard user interface may be used to access multiple tester types, reducing the amount of training necessary for the user. To further reduce the amount of training required, a user-specific interface is provided that allows the user to perform testing functions related to their role.

Further, according to another aspect of the present invention, a testing architecture is provided that permits a user to perform testing functions from any location. In one specific implementation, the user interface is accessed through a browser program, and a user may perform testing functions from any location coupled to a testing system through a communications network. In a traditional environment, the UI is normally tied to the machine, however, if the UI is made available over a network, the user can perform testing from another location.

Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears.

According to one aspect of the present invention, a system comprises a test program, an platform adapted to generate a plurality of function calls in response to requests from the test program, an abstraction layer that is adapted to map the plurality of function calls into instructions to be executed on test hardware. According to one embodiment of the present invention, the abstraction layer further comprises a virtual instrument ("VI") interface to the platform. According to another embodiment of the invention, the abstraction layer further comprises a virtual multisite ("VMI") interface to the platform. According to another embodiment of the invention, the abstraction layer further comprises a system physical instrument ("SystemPI") interface to the platform. According to another embodiment of the invention, the abstraction layer further comprises a physical instrument ("PI") interface to the platform. According to another embodiment of the invention, the abstraction layer further includes a virtual instrument ("VI") to physical instrument ("PI") interface.

According to one embodiment of the present invention, the abstraction layer further includes a system physical instrument ("SystemPI") to virtual instrument ("VI") interface. According to another embodiment of the invention, the abstraction layer further includes a system physical instrument ("SystemPI") to physical instrument ("PI") interface. According to another embodiment of the invention, the abstraction layer further includes a test program to virtual instrument ("VI") interface. According to another embodiment of the invention, the abstraction layer further includes a test program to physical instrument ("PI") interface. According to another embodiment of the invention, the abstraction layer further includes a platform to virtual instrument ("VI") interface. According to another embodiment of the invention, the abstraction layer further includes a platform to physical instrument ("PI") interface. According to another embodiment of the invention, the abstraction layer further includes a platform to virtual multisite instrument ("VMI") interface.

According to one embodiment of the present invention, the abstraction layer further comprises an interface generation engine. According to another embodiment of the invention, the interface generation engine includes a graphical user interface adapted to guide a user through generation of an interface. According to another embodiment of the invention, the interface generation engine generates an interface to manage communication between components of the system. According to another embodiment of the invention, the interface generation engine generates an interface to manage communication between components of the abstraction layer. According to another embodiment of the invention, the interface generation engine generates an interface to manage communication between the platform and the abstraction layer. According to another embodiment of the invention, managing communication between the platform and the abstraction layer includes mapping the plurality of function calls to instructions to be executed on test hardware. According to another embodiment of the invention, mapping the plurality of function calls includes mapping the plurality of function calls to a virtual instrument ("VI") module. According to another embodiment of the invention, mapping the plurality of function calls includes mapping the plurality of function calls to a system physical instrument ("System PI") module. According to another embodiment of the invention, mapping the plurality of function calls includes mapping the plurality of function calls to a physical instrument ("PI") module.

According to one embodiment of the present invention, mapping the plurality of function calls includes mapping a base class of physical instrument function calls to a physical instrument ("PI") module. According to another embodiment of the invention, mapping the plurality of function calls includes mapping a base class of physical instrument function calls to a physical instrument ("PI") module. According to another embodiment of the invention, the abstraction layer further comprises a rules checking engine. According to another embodiment of the invention, the rules checking engine is adapted to verify the mapping of function calls to instructions on the test hardware. According to another embodiment of the invention, the rules checking engine verifies the mapping by simulating a request for the function call. According to another embodiment of the invention, the rules checking engine verifies the mapping by accepting a response as a result of the simulated function call in an expected format. According to another embodiment of the invention, the rules checking engine returns a code to the operating platform indicating that the function call was mapped properly. According to another embodiment of the invention, the rules checking engine identifies an improper mapping by accepting a return code in response to the simulated function call that is not in the expected format. According to another embodiment of the invention, the system further comprises an interface between the test program and the platform.

According to one embodiment of the present invention, the test program provides a graphical user interface to a user. According to another embodiment of the invention, the test program enables a user to define tests to be executed upon a device. According to another embodiment of the invention, the test program enables a user to define tests to be executed upon a device to occur at any time. According to another embodiment of the invention, the abstraction layer further comprises an physical instrument abstraction layer representing the functionality of hardware resources of the test system. According to another embodiment of the invention, the physical instrument abstraction layer includes a physical instrument module that maps to a hardware resource. According to another embodiment of the invention, the PI module causes execution of instructions on a hardware resource in response to requests. According to another embodiment of the invention, a hardware resource includes at least one function available on the test hardware. According to another embodiment of the invention, the hardware resource is adapted to cause the generation of a synchronization signal. According to another embodiment of the invention, the hardware resource is adapted to cause a device state query.

According to one embodiment of the present invention, the PI module includes a function call that will cause a device to power on and/or initialize in dependence upon a device starting state. According to another embodiment of the invention, the physical instrument module includes a base class of PI function calls. According to another embodiment of the invention, the base class of PI function calls includes the power on and/or initialize function. According to another embodiment of the invention, the abstraction layer further comprises a virtual instrument abstraction layer that represents a virtualization of hardware functions that may be performed on the test system. According to another embodiment of the invention, the virtual instrument abstraction layer includes a virtual instrument ("VI") module, to which at least one hardware resource is mapped. According to another embodiment of the invention, the VI module is adapted to cause the execution of instructions on a hardware resource in response to requests. According to another embodiment of the invention, the mapping to at least one resource is mapped through at least one PI module for each of the at least one hardware resource. According to another embodiment of the invention, the VI module is mapped to a plurality of PI modules to render a virtual representation of a set of predefined hardware resources employed to test a particular device.

According to one embodiment of the present invention, the VI module is adapted to be modified to include an additional PI module, expanding the set of hardware resources available to test a device through the VI module. According to another embodiment of the invention, the VI module is adapted to include a base class of functions that map to test hardware resources necessary for any ATE tester. According to another embodiment of the invention, the abstraction layer further comprises a system abstraction layer adapted to manage requests to hardware resources. According to another embodiment of the invention, the system abstraction layer is further adapted to map requests from a physical instrument layer so that hardware resources perform their functions in response to requests. According to another embodiment of the invention, the system abstraction layer is further adapted to define a base set of system function calls available to other components of the abstraction layer. According to another embodiment of the invention, the system layer further comprises a SystemPI module adapted to define a base set of system function calls that cause operations to be performed any the other components of the abstraction layer. According to another embodiment of the invention, the system abstraction layer is further adapted to perform queries on components of the abstraction layer.

According to one embodiment of the present invention, the system abstraction layer includes a system physical instrument module. According to another embodiment of the invention, the platform layer includes an "off the shelf" operating system. According to another embodiment of the invention, the "off the shelf" operating system is enhanced to perform deterministically. According to another embodiment of the invention, the "off the shelf" operating system is Windows XP, and it is enhanced using the Tenasys INtime operating system to operate deterministically.

According to one aspect of the present invention, an automated test equipment system is provided. The system comprises a platform abstraction layer adapted to manage the operation of abstraction layers of the automated test equipment system, a physical instrument ("PI") abstraction layer adapted to map PI function calls to hardware so that the hardware performs a function in response to a PI function call, a virtual instrument ("VI") abstraction layer adapted to map to the PI abstraction layer so that the VI abstraction layer represents a virtualization of hardware functions that may be performed, a system abstraction layer adapted to map system function calls to enable the hardware to perform functions in response to PI function calls, and a test program abstraction layer adapted to interact with the virtual instrument layer to initiate functions performed on hardware. According to one embodiment of the present invention, the system abstraction layer is further abstracted into a system physical instrument ("SystemPI") module that receives requests from the PI abstraction layer and causes hardware to perform its function in response. According to another embodiment of the invention, the SystemPI module is further adapted to aggregate information reported by the other abstraction layers of the automated test equipment system. According to another embodiment of the invention, the information aggregated includes success or failure of function calls made in the other abstraction layers of the automated test equipment system. According to another embodiment of the invention, the information aggregated includes reporting by operations in the other abstraction layers of the automated test equipment system. According to another embodiment of the invention, SystemPI module is further adapted to accept queries on the information aggregated.

According to one embodiment of the present invention, SystemPI module is further adapted to report on the information aggregated. According to another embodiment of the invention, the test program abstraction layer includes a test program adapted to present a graphical user interface to a user. According to another embodiment of the invention, the test program layer is further adapted to permit a user to interact with the virtual instrument layer. According to another embodiment of the invention, the test program layer is further adapted to permit a user to define tests to be performed on a device. According to another embodiment of the invention, the test program is further adapted to graphically render the results of performed tests. According to another embodiment of the invention, the test program layer is further adapted to permit a user to define tests to be performed on a device, wherein the tests to be performed occur at a scheduled time. According to another embodiment of the invention, tests to be performed can occur on any user defined schedule. According to another embodiment of the invention, the virtual instrument abstraction layer includes a VI module, wherein the VI module includes a mapping to at least one hardware resource.

According to one embodiment of the present invention, the VI module is adapted to cause the at least one hardware resource to perform its function in response to requests. According to another embodiment of the invention, the VI module causes the at least one hardware resource to perform its function in response to a request from the test program abstraction layer. According to another embodiment of the invention, the mapping to the at least one hardware resource is mapped through the PI instrument layer. According to another embodiment of the invention, the mapping to the at least one hardware resource is mapped through a PI module. According to another embodiment of the invention, the VI module is mapped to a plurality of PI modules so that the VI module renders a virtual representation of a plurality of hardware resources employed to test a device. According to another embodiment of the invention, the mapping between the VI Module and the PI module is managed by an interface. According to another embodiment of the invention, the interface is a graphical user interface. According to another embodiment of the invention, the interface manages communication between the VI Module and the PI module in a predetermined format. According to another embodiment of the invention, the VI module is adapted to be modified to include a mapping to an additional PI module. According to another embodiment of the invention, the VI module is adapted to include a base class of functions that map to test hardware resources necessary for any ATE tester. According to another embodiment of the invention, the physical instrument abstraction layer includes a PI module that contains the implementation details of a hardware resource.

According to one embodiment of the present invention, the physical instrument abstraction layer includes a PI module that contains the implementation details of each hardware resource. According to another embodiment of the invention, the physical instrument abstraction layer is adapted incorporate the implementation details of a new hardware resource. According to another embodiment of the invention, the new hardware resource is mapped to by a new PI module. According to another embodiment of the invention, the PI module causes execution of the hardware resource's functionality in response to requests. According to another embodiment of the invention, the request comes from a VI module. According to another embodiment of the invention, the hardware resource's functionality includes a synchronization signal. According to another embodiment of the invention, the physical instrument module includes a function call that will cause a hardware resource to power on and/or initialize. According to another embodiment of the invention, the function call includes the PowerOnInitialize function. According to another embodiment of the invention, the PI abstraction layer includes a base class of PI function calls. According to another embodiment of the invention, the base class of PI function calls includes the function call adapted to cause a hardware resource to power on and/or initialize.

According to one embodiment of the present invention, the function call adapted to cause a hardware resource to power on and/or initialize includes the PowerOnInitialize function. According to another embodiment of the invention, the platform abstraction layer includes an "off the shelf" operating system. According to another embodiment of the invention, the "off the shelf" operating system is enhanced to perform deterministically. According to another embodiment of the invention, the "off the shelf" operating system is Windows XP. According to another embodiment of the invention, the operating system is enhanced to perform deterministically using real-time extensions. According to another embodiment of the invention, the real-time extensions are provided through the "Tenasys INtime" operating system. According to another embodiment of the invention, the platform abstraction layer operates deterministically.

According to another embodiment of the invention, the system further comprises an interface abstraction layer adapted to manage the communication between the abstraction layers. According to another embodiment of the invention, the interface abstraction layer is further adapted to insure standardized communication between the abstraction layers. According to another embodiment of the invention, the interface abstraction layer includes a interface between the platform abstraction layer and the VI abstraction layer. According to another embodiment of the invention, the interface abstraction layer includes a interface between the platform abstraction layer and the system abstraction layer.

According to one embodiment of the present invention, the interface abstraction layer includes a interface between the platform abstraction layer and the physical instrument abstraction layer. According to another embodiment of the invention, the interface abstraction layer includes a interface between a VI module and a PI module. According to another embodiment of the invention, the interface abstraction layer includes an interface between a SystemPI module and a VI module. According to another embodiment of the invention, the interface abstraction layer includes an interface between a SystemPI module and a PI module. According to another embodiment of the invention, the interface abstraction layer includes a interface between the platform abstraction layer and the VI abstraction layer. According to another embodiment of the invention, the system further comprises a module generation engine adapted to guide a user through the creation of one of a PI module and a VI module so that the automated test system is capable incorporating new test hardware resources. According to another embodiment of the invention, the system further comprises an interface generation engine adapted to guide a user through the creation of an interface, wherein the interface will manage communication between modules by standardizing the format of communication without consideration of the hardware, software or platform being employed on the automated test system.

According to one embodiment of the present invention, the system further comprises a rule checking engine adapted to verify the test functionality of a generated module and its generated interface. According to another embodiment of the invention, the system further comprises an installation module adapted to permit a user to install the generated module so that the test program could direct requests to the generated module and have test functions performed. According to another embodiment of the invention, the system further comprises an installation module adapted to permit a user to install the generated interface so that the test program may direct requests to the test hardware resources mapped to by the generated module and have test functions performed. According to one aspect of the present invention, a system for performing a testing process is provided. The system comprises a test program that, when executed, performs a procedure on one or more test instruments, the one or more test instruments having respective one or more driver programs, and a virtual instrument entity adapted to execute the procedure on the one or more test instruments, wherein the virtual instrument entity accesses the one or more test instruments through the respective one or more driver programs. According to another embodiment of the invention, the virtual instrument entity includes one or more functions. According to another embodiment of the invention, the test program is adapted to access the one or more test instruments by accessing the one or more functions of the virtual instrument. According to another embodiment of the invention, the test program is programmed to access the one or more instruments only through the virtual instrument. According to another embodiment of the invention, the test program is programmed to access a system physical interface to gain access to tester resources. According to another embodiment of the invention, the virtual instrument entity isolates the test program from programming interfaces specific to the one or more test hardware. According to another embodiment of the invention, the virtual instrument includes a virtual instrument programming interface. According to another embodiment of the invention, a change in the one or more test instruments does not produce a corresponding change in the virtual instrument programming interface.

According to one embodiment of the present invention, a change in the virtual instrument entity does not produce a corresponding change in the one or more functions. According to another embodiment of the invention, a change in a physical tester resource does not produce a corresponding change in the one or more functions. According to another embodiment of the invention, a change in a testing development platform does not require a change in the test platform. According to another embodiment of the invention, the one or more functions are loaded in a memory structure of a computer system. According to another embodiment of the invention, the change in the virtual instrument entity does not produce a corresponding change in the memory structure of the computer system. According to another embodiment of the invention, the one or more functions are located in a first location in the memory structure of the computer system. According to another embodiment of the invention, the change in the virtual instrument entity includes adding one or more additional functions. According to another embodiment of the invention, the change in the virtual instrument entity includes modifying at least one of the one or more functions. According to another embodiment of the invention, the one or more additional functions are added in a second location following the first location in the memory structure of the computer system. According to another embodiment of the invention, the addition of the one or more additional functions does not change the location of the one or more functions in the first location in the memory structure of the computer system. According to another embodiment of the invention, the memory structure of the computer system further comprises a vtable. According to another embodiment of the invention, the addition of the one or more additional functions does not change a location of the one or more functions in the vtable. According to another embodiment of the invention, the change in the virtual instrument entity includes adding at least one modified function.

According to one embodiment of the present invention, the at least one modified function is modified from the at least one of the one or more functions. According to another embodiment of the invention, the at least one modified function is added in a second location following the first location in the memory structure of the computer system. According to another embodiment of the invention, the addition of the at least one modified function does not change the location of the one or more functions in the first location in the memory structure of the computer system. According to another embodiment of the invention, the memory structure of the computer system further comprises a vtable. According to another embodiment of the invention, the addition of the at least one modified function does not change a location of the one or more functions in the vtable.

According to another embodiment of the invention, the one or more functions is included in a base programming class of functions, and the base programming class is inherited from an extended class of functions including the one or more additional functions. According to another embodiment of the invention, the one or more functions is included in a base programming class of functions, and the base programming class is inherited from an extended class of functions including the at least one modified function. According to another embodiment of the invention, the computer system includes a general-purpose computer system. According to another embodiment of the invention, the one or more test instruments are coupled to one or more devices under test. According to another embodiment of the invention, at least one of the one or more test instruments is programmed by the test program to apply a test signal to at least one of the one or more devices under test.

According to one aspect of the present invention a system for performing a testing process is provided. The system comprises one or more test instruments, each having respective one or more driver programs and wherein at least one of the driver programs includes one or more functions, a test program that, when executed, performs a procedure on the one or more test instruments, the test program accessing the one or more test instruments through the one or more driver programs, and a memory structure, wherein the one or more functions of the at least one of the driver programs are contained within a fixed location with the memory structure. According to one embodiment of the present invention, the memory structure is included in a memory of a computer system, and wherein the one or more functions are loaded in the memory of the computer system. According to another embodiment of the invention, a change in the at least one of the driver programs does not produce a corresponding change in the memory structure. According to another embodiment of the invention, the one or more functions are located in a first location in the memory structure. According to another embodiment of the invention, the change in the at least one of the driver programs includes adding one or more additional functions. According to another embodiment of the invention, the change in the at least one of the driver programs includes modifying at least one of the one or more functions.

According to one embodiment of the present invention, the one or more additional functions are added in a second location following the first location in the memory structure. According to another embodiment of the invention, the addition of the one or more additional functions does not change the location of the one or more functions in the first location in the memory structure. According to another embodiment of the invention, the memory structure further comprises a vtable. According to another embodiment of the invention, the addition of the one or more additional functions does not change a location of the one or more functions in the vtable. According to another embodiment of the invention, the change in the virtual instrument entity includes adding at least one modified function. According to another embodiment of the invention, a change in a platform entity includes adding at least one modified function. According to another embodiment of the invention, a change in a physical instrument driver includes adding at least one modified function. According to another embodiment of the invention, the at least one modified function is modified from the at least one of the one or more functions.

According to one embodiment of the present invention, the at least one modified function is added in a second location following the first location in the memory structure. According to another embodiment of the invention, the addition of the at least one modified function does not change the location of the one or more functions in the first location in the memory structure. According to another embodiment of the invention, the memory structure further comprises a vtable. According to another embodiment of the invention, the addition of the at least one modified function does not change a location of the one or more functions in the vtable. According to another embodiment of the invention, the one or more functions is included in a base programming class of functions, and the base programming class is inherited from an extended class of functions including the one or more additional functions. According to another embodiment of the invention, the one or more functions is included in a base programming class of functions, and the base programming class is inherited from an extended class of functions including the at least one modified function. According to another embodiment of the invention, the computer system includes a general-purpose computer system. According to another embodiment of the invention, the one or more test instruments are coupled to one or more devices under test. According to another embodiment of the invention, at least one of the one or more test instruments is programmed by the test program to apply a test signal to at least one of the one or more devices under test.

According to one embodiment of the present invention, the system is part of an automated test system. According to another embodiment of the invention, the system further comprises a virtual instrument entity adapted to execute the procedure on the one or more test instruments, wherein the virtual instrument entity accesses the one or more test instruments through the respective one or more driver programs. According to another embodiment of the invention, the virtual instrument entity includes one or more functions. According to another embodiment of the invention, the test program is adapted to access the one or more test instruments by accessing the one or more functions of the virtual instrument. According to another embodiment of the invention, the test program is programmed to access the one or more instruments only through the virtual instrument. According to another embodiment of the invention, the virtual instrument entity isolates the test program from programming interfaces specific to the one or more test hardware. According to another embodiment of the invention, the virtual instrument includes a virtual instrument programming interface. According to another embodiment of the invention, a change in the one or more test instruments does not produce a corresponding change in the virtual instrument programming interface. According to another embodiment of the invention, a change in the virtual instrument entity does not produce a corresponding change in the one or more functions. According to another embodiment of the invention, the one or more functions are loaded in a memory structure of a computer system.

According to one embodiment of the present invention, the change in the virtual instrument entity does not produce a corresponding change in the memory structure of the computer system. According to another embodiment of the invention, the one or more functions are located in a first location in the memory structure of the computer system. According to another embodiment of the invention, the change in the virtual instrument entity includes adding one or more additional functions. According to another embodiment of the invention, the change in the virtual instrument entity includes modifying at least one of the one or more functions. According to another embodiment of the invention, the one or more additional functions are added in a second location following the first location in the memory structure of the computer system. According to another embodiment of the invention, the addition of the one or more additional functions does not change the location of the one or more functions in the first location in the memory structure of the computer system. According to another embodiment of the invention, the memory structure of the computer system further comprises a vtable. According to another embodiment of the invention, the addition of the one or more additional functions does not change a location of the one or more functions in the vtable. According to another embodiment of the invention, the change in the virtual instrument entity includes adding at least one modified function. According to another embodiment of the invention, the at least one modified function is modified from the at least one of the one or more functions. According to another embodiment of the invention, the at least one modified function is added in a second location following the first location in the memory structure of the computer system.

According to one embodiment of the present invention, the addition of the at least one modified function does not change the location of the one or more functions in the first location in the memory structure of the computer system. According to another embodiment of the invention, the memory structure of the computer system further comprises a vtable. According to another embodiment of the invention, the addition of the at least one modified function does not change a location of the one or more functions in the vtable. According to another embodiment of the invention, the change in the virtual instrument entity includes adding one or more additional functions. According to another embodiment of the invention, the one or more functions is included in a base programming class of functions, and the base programming class is inherited from an extended class of functions including the one or more additional functions. According to another embodiment of the invention, the one or more functions is included in a base programming class of functions, and the base programming class is inherited from an extended class of functions including the at least one modified function. According to another embodiment of the invention, the computer system includes a general-purpose computer system.

According to one aspect of the present invention, a system for performing a testing process is provided. The system comprises a test program that, when executed, performs a procedure on a plurality of test instruments, the one or more test instruments having respective one or more driver programs, and a virtual multisite instrument entity adapted to execute the procedure on the plurality of test instruments, wherein the virtual instrument entity accesses the plurality of test instruments through the respective one or more driver programs, wherein the virtual multisite instrument entity is adapted to execute the procedure on the plurality of test instruments transparently to the test program. According to one embodiment of the present invention, the virtual multisite instrument includes functionality that controls a plurality of instrument sites. According to another embodiment of the invention, the virtual multisite instrument entity includes one or more functions. According to another embodiment of the invention, the test program is adapted to access the plurality of instruments by accessing the one or more functions of the virtual instrument. According to another embodiment of the invention, the test program is programmed to access the plurality of instruments only through the virtual instrument. According to another embodiment of the invention, the virtual multisite instrument isolates the test program from programming interfaces specific to the plurality of instruments. According to another embodiment of the invention, the virtual multisite instrument includes a virtual multisite instrument programming interface.

According to one embodiment of the present invention, a change in at least one of the plurality of test instruments does not produce a corresponding change in the virtual multisite instrument programming interface. According to another embodiment of the invention, a change in the virtual multisite instrument entity does not produce a corresponding change in the one or more functions. According to another embodiment of the invention, the one or more functions are loaded in a memory structure of a computer system. According to another embodiment of the invention, the change in the virtual multisite instrument entity does not produce a corresponding change in the memory structure of the computer system. According to another embodiment of the invention, the virtual multisite instrument entity is adapted to execute the procedure substantially in parallel on the plurality of test instruments.

According to one aspect of the present invention, a system for performing a testing process is provided. The system comprises a test system, and at least one client computer coupled to the test system by a communication network, wherein a user operating the client computer is capable of executing a plurality of testing functions on the test system. According to one embodiment of the present invention, the system further comprises a test program that, when executed, performs a procedure on one or more test instruments, the one or more test instruments having respective one or more driver programs. According to another embodiment of the invention, the system further comprises a process that receives one or more requests from client computers through the communication network. According to another embodiment of the invention, the at least one client computer includes a user interface component for accessing the test system. According to another embodiment of the invention, the user interface component is operated using a browser program executing on the at least one client computer. According to another embodiment of the invention, the test system further comprises a virtual multisite instrument entity adapted to execute the procedure on the plurality of test instruments, wherein the virtual instrument entity accesses the plurality of test instruments through the respective one or more driver programs, wherein the virtual multisite instrument entity is adapted to execute the procedure on the plurality of test instruments transparently to the test program.

According to one embodiment of the present invention, the test system further comprises a virtual instrument entity adapted to execute the procedure on the one or more test instruments, wherein the virtual instrument entity accesses the one or more test instruments through the respective one or more driver programs. According to another embodiment of the invention, the user interface component is configured based on the user operating the client computer. According to another embodiment of the invention, the test system is adapted to store a plurality of user interfaces, and is adapted to provide at least one user interface to the user based on a user interface configuration associated with the user. According to another embodiment of the invention, the virtual instrument entity includes one or more functions. According to another embodiment of the invention, the test program is adapted to access the one or more test instruments by accessing the one or more functions of the virtual instrument. According to another embodiment of the invention, the test program is programmed to access the one or more instruments only through the virtual instrument. According to another embodiment of the invention, the virtual instrument entity isolates the test program from programming interfaces specific to the one or more test hardware. According to another embodiment of the invention, the virtual instrument includes a virtual instrument programming interface.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
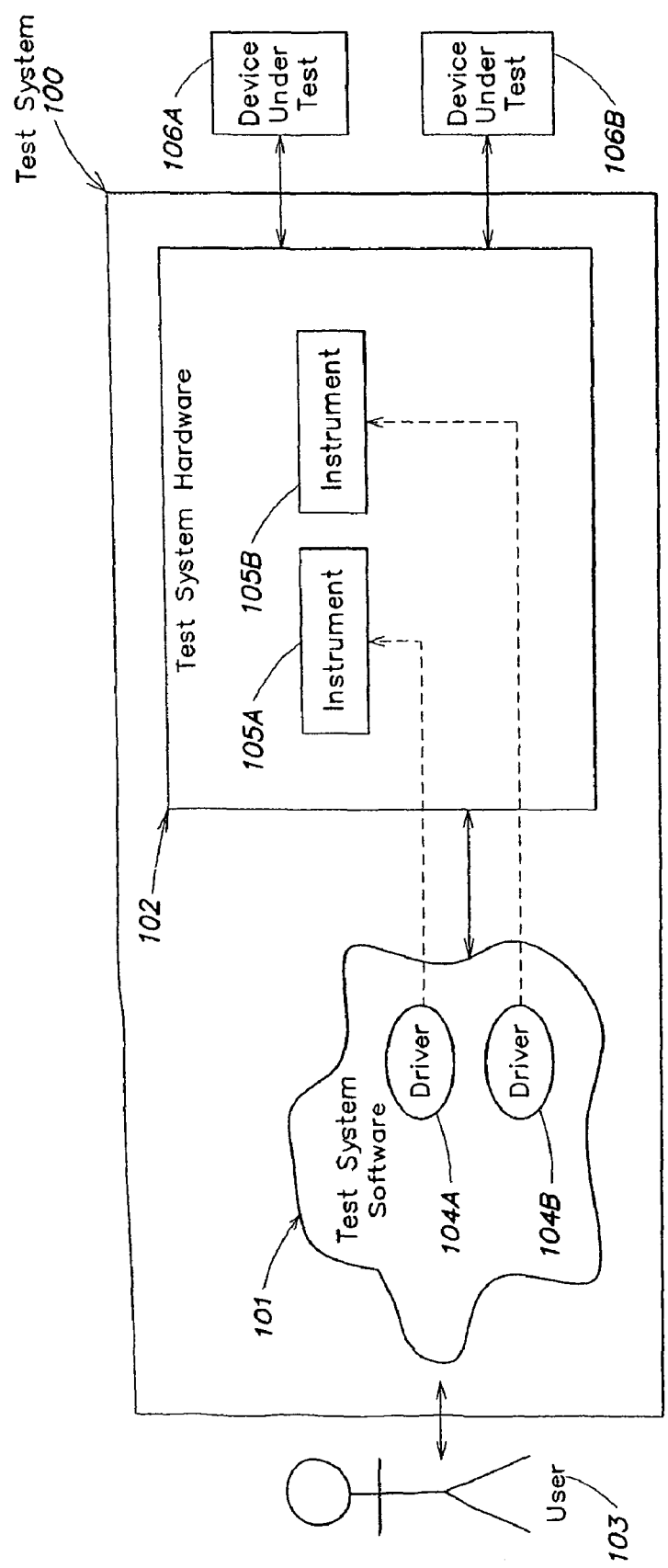
FIG. 1 shows a block diagram of an example conventional test system architecture.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

A system and method is provided for performing processing in a testing system such as an ATE system. According to one aspect of the present invention, it is appreciated that conventional ATE systems are expensive due primarily to the tight coupling between software and hardware. According to one aspect of the present invention, an improved method for performing processing in an ATE system is provided which reduces the overall cost of software. For instance, in an ATE system, it may be useful to implement general-purpose computer systems, processors, and/or software to reduce the cost of ownership and maintenance of such systems. In one example, various aspects of the invention may be embodied using off-the-shelf hardware and software (e.g., a general-purpose computer system, a commodity operating system (e.g., Windows NT), etc.). Thus, the cost of developing an ATE system may be a fraction of the cost of a specially-designed system using specifically-developed hardware and software. Thus, any method for reducing the overall cost of developing such a system is beneficial.

FIG. 1 shows a block diagram of an example conventional test system architecture. For example, a conventional test system 100 generally includes one or more portions of test system software 101 along with any corresponding test system hardware 102. The test system software may include, for example, an operating system, which is generally a special-purpose operating system, one or more test system software drivers (e.g., 104A-104B), and any testing applications developed for testing one or more devices under test 106A-106B. In the case of an automated test system 100, test system software 101 includes software drivers (e.g., 104A) that are implementation-specific to the instrument (e.g., instrument 105A) to which the driver communicates. It follows that the test system software 101 which communicates with one or more software drivers is specifically-programmed to communicate with test system hardware 102 through such drivers (e.g., drivers 104A-104B).

According to one aspect of the present invention, it is appreciated that each time a driver or its corresponding instrument is changed, there must be a corresponding change to the driver and/or instrument. Because the test system software 101 such as, for instance, an operating system, test applications, or other software entities are written specifically to communicate through such drivers, that a corresponding change in the driver or hardware forces a change in the test system software 101. Because of this coupling, the test system software 101 must be recertified to work with software drivers and/or instruments which have been changed or added to test system 100. Further, a user 103 that writes test programs to work on test system 100 must perform additional effort to ensure that their test programs work with the changed environment.

Figure 2:
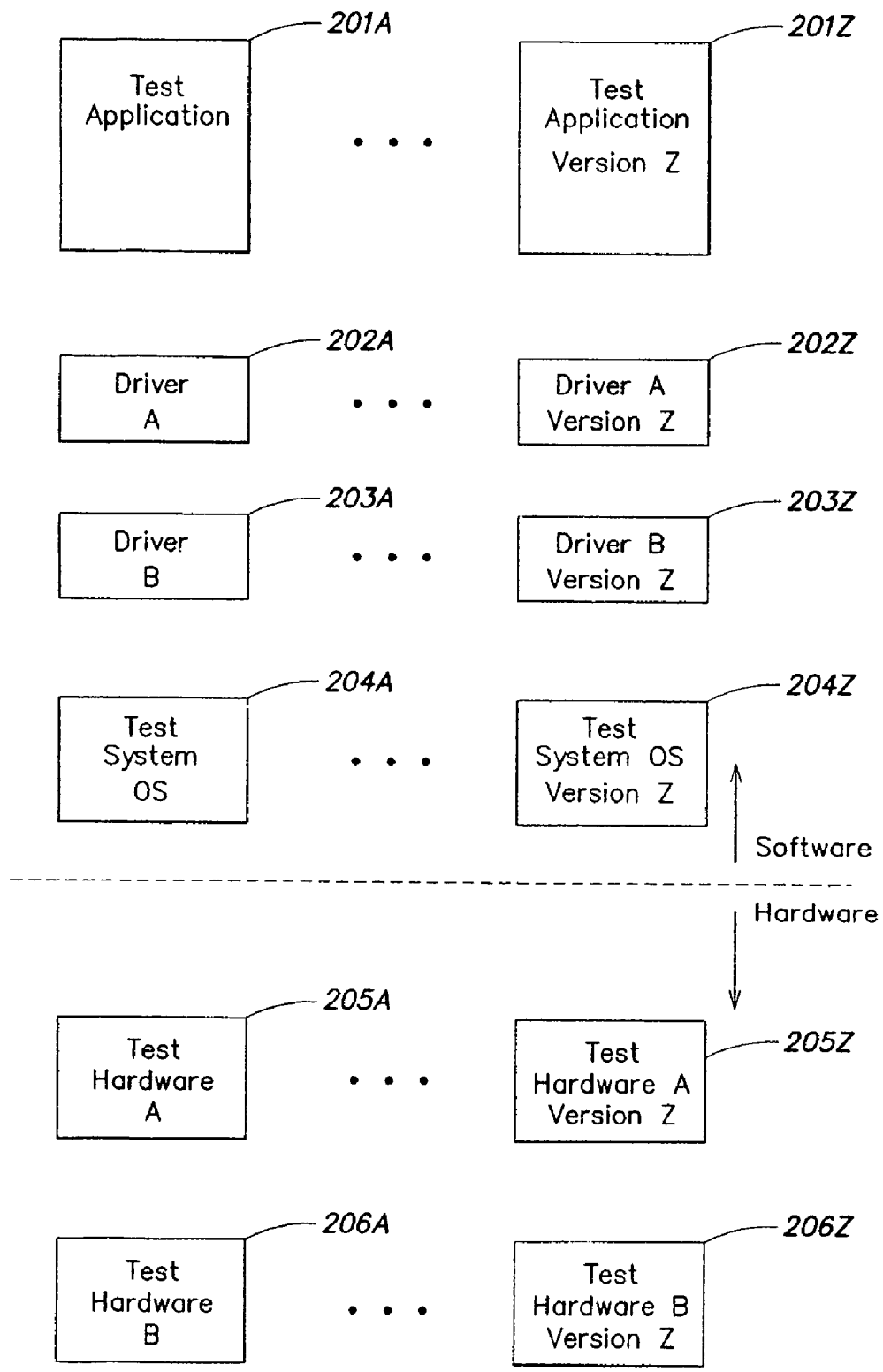
FIG. 2 shows a block diagram of another example conventional test system architecture.

FIG. 2 shows a block diagram of another example conventional test system architecture that describes in more detail some of the problems in the conventional test programming environment. For example, a test system 100 may include test system software 101 that comprises one or more test applications 201A-201Z, each of which may have different versions having varying capabilities to work with one or more types of software and hardware. Similarly, there may be on a particular test system one or more drivers (e.g., driver A 202A and driver B 203A) each of which may have one or more versions associated with it (e.g., driver A versions 202A-202Z and driver B versions 203A-203Z). Further complication includes the test system operating system which itself may have one or more versions 204A-204Z and which may be configured to work with any number of other software entities including drivers, applications, or other entities.

Similarly, test system hardware 102 may include one or more test hardware entities (e.g., test hardware A 205A, test hardware B 206A) that may include one or more versions (e.g., test hardware A versions 205A-205Z, test hardware B versions 206A-206Z) that may have various interfaces and features. According to one aspect of the present invention, a modification in any one of these entities may cause communication or function to perform differently and cause the overall test system 100 to fail. In an ATE environment which requires that test programs be performed in a deterministic way, such a non-deterministic operation would not be desired.

According to one aspect of the present invention, a virtual instrument is provided that isolates software applications from the underlying drivers and hardware (e.g., a test instrument) such that a change in the driver or instrument does not affect the function of higher layer software such as an operating system, a testing application or other software entity.

Figure 3:
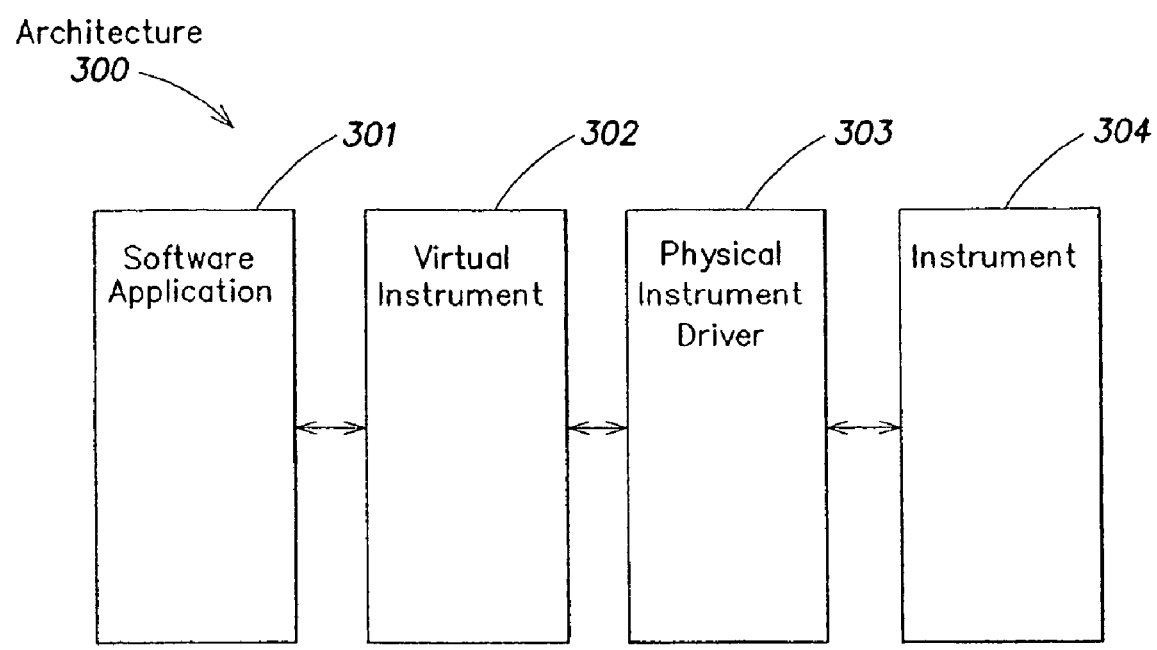
FIG. 3 shows a block diagram of a test system architecture according to one embodiment of the present invention.

FIG. 3 shows a block diagram of a test system architecture according to one embodiment of the present invention that provides isolation between entities of a test system. An architecture 300 is provided wherein a software application 301, which may include, for example, a test system application, an operating system, or any other type of software entity which is isolated from details of the physical instrument driver 303 and physical instrument 304 by a virtual instrument 302.

Virtual instrument 302 may become, for example, an abstraction layer that isolates the software application 301 and physical instrument driver 303 layers. Virtual instrument 302 may include, for example, code that performs a mapping between an abstract virtual instrument interface (not shown) and functions and data existing within the physical instrument driver 303.

According to one embodiment of the present invention, the interface presented by the virtual instrument is a standard instrument interface that is independent of the underlying hardware. In one example system, the virtual instrument interface is written from the perspective of functionality that a user would generally like to perform (for instance, generate a wave form for a device under test (DUT)). Generally, the user is not concerned with specifics of the hardware, and they are only concerned with providing predictable stimuli and receiving predictable results. Therefore, an interface is provided that presents to the user hardware-independent functional interfaces that can be accessed by users' test programs in a standard way. Because of such a standardization of a virtual instrument, underlying physical instrument drivers and their corresponding instruments may be added or substituted without affecting the operation of upper layer software applications 301.

System Platform Architecture

Various aspects of the present invention may be implemented as a part of an overall system architecture that permits developers, equipment manufacturers, test equipment companies and other types of users to program test programs used for testing various devices under test (DUTs).

Figure 4:
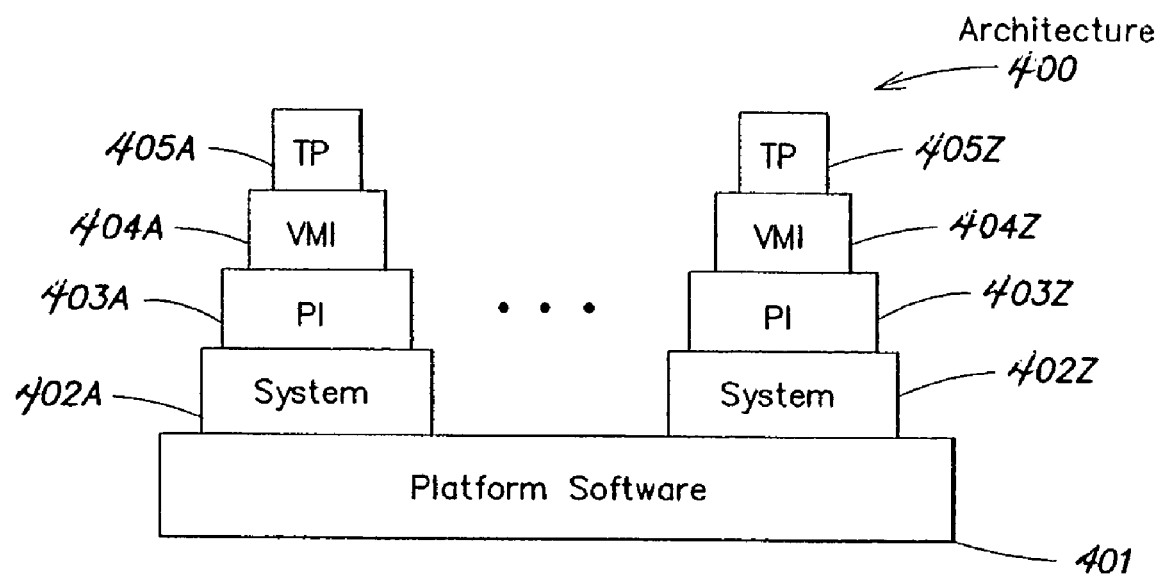
FIG. 4 is a block diagram of a test system architecture according to one embodiment of the present invention.

In one specific architecture 400 as shown in FIG. 4, one or more test programs 405A-405Z are developed by one or more users to operate on platform software 401. In particular, test programs 405A-405Z may be programmed to access test hardware through a virtual multisite instrument layer 404A-404Z. Such virtual multi-site instruments are discussed in more detail below, but in general are similar to virtual instruments above in function in that they provide a virtual interface to one or more hardware devices. Such interfaces, according to one embodiment, may be capable of presenting a hardware-independent interface for performing test functions in an ATE system.

In one embodiment, the software interface to a physical piece of hardware is implemented to what is referred to herein as a "Physical Instrument" (PI) module. Each piece of instrumentation hardware is accompanied by an associated PI module that implements the basic functionality provided by the hardware. According to one embodiment, the user's test program (TP) does not interact directly with a PI layer (403A-403Z) entities (e.g., a PI module). Rather, from the user test program's point of view, interaction with the test instrumentation is made through what is referred to herein as a "Virtual Multisite Instrument" (VMI) discussed further below. In one implementation, VMIs implement their functionality by using one or more PIs, which in turn, access one or more instruments.

According to another embodiment of the present invention, what is referred to herein as a Virtual Multisite Instrument (VMI) is provided that facilitates management of multiple testing sites. In a traditional testing environment, it is appreciated that a site is managed as a singular entity in that if a particular testing site is configured, a test program is developed for the particular site, specific to the particular testing hardware used. If multiple sites are needed to perform additional testing (e.g., to satisfy an increased testing capacity), then additional test hardware configurations are purchased, and the test program is matriculated to the additional sites.

According to one aspect of the present invention, because details of the underlying hardware is abstracted from test programs via an abstraction layer (e.g., a virtual instrument layer), test programs can be managed independent of test hardware, and the abstraction layer may be capable of managing the administration of a test program to multiple sites via the abstraction layer. In one embodiment, the virtual instrument may have capability to map to multiple instrument sites. In this way, the time needed to maintain and administer test programs to multiple sites is reduced.

In one example, PIs can access test system resources through a specially-defined PI referred to herein as the "System PI." According to one embodiment, the System PI layer (e.g., layers 402A-402Z) provides an interface that allows other PIs to use test system resources such as for example, system memory, system triggers, and other resources. In another embodiment, the System PI may provide a communication interface to other instruments in a test system.

Practically, PIs may be implemented, for example, in a general purpose computer system as a software library function (e.g., a Dynamic Linked Library (DLL) as well-known in the Windows NT operating system). Appropriate PI modules may be loaded as needed, depending on the hardware present in the test system.

In one implementation, each PI is uniquely identified by a unique identifier. In one example, the unique identifier may be unique across the test system to uniquely identify a particular PI implementation. Such identification may be useful, for example, for communicating with PIs by other entities within the test system.

According to one embodiment, the system layer (e.g., as implemented by a system driver) interfaces that allow for VMI and PI to be built upon the system layer. In another implementation, the VMI layer provides an abstraction layer from the hardware, which is encapsulated by the PI and System Driver software. In another embodiment, the system layer can also expose functions to the test program for system specific resources (e.g., a calibration meter).

In another embodiment, the Test Program exposes any VMI functions to the user—as a Virtual Instrument, the test program provides these functions in a manner which captures what the user wants the test solution to look like. The interfaces are guided by rules: add only, existing functions do not change in execution functionality or performance. Also, in one implementation each module performs version checking on module being interacted with so that adequate performance between modules is ensured.

Such rules may allow, for example, for complete forward-backward compatibility of the modules. That is, each module can be versioned independently and all versions can work interchangeably. This permits, for example, test programs designed with a given version of VMIs can use any PI and System Driver (of the same type) version equal-to or greater-than the versions used to when the test program was created and compiled.

According to another embodiment, architecture 400 may include platform software 401. In one embodiment, the functionality provided by a conventional computer operating system is abstracted to be part of the platform software layer. According to one embodiment, the platform layer is abstracted so that almost any operating system can be used with an ATE tester, such as general-purpose operating systems as discussed further below. In one embodiment, the platform software layer 401 provides the basic functionality required by all the various components of the ATE tester to operate and communicate. In one embodiment, the Windows XP or Windows Vista operating systems may be used as the base operating system, which may govern basic functions required by the various ATE tester components. However, it should be appreciated that other operating systems may be used.

Figure 5:
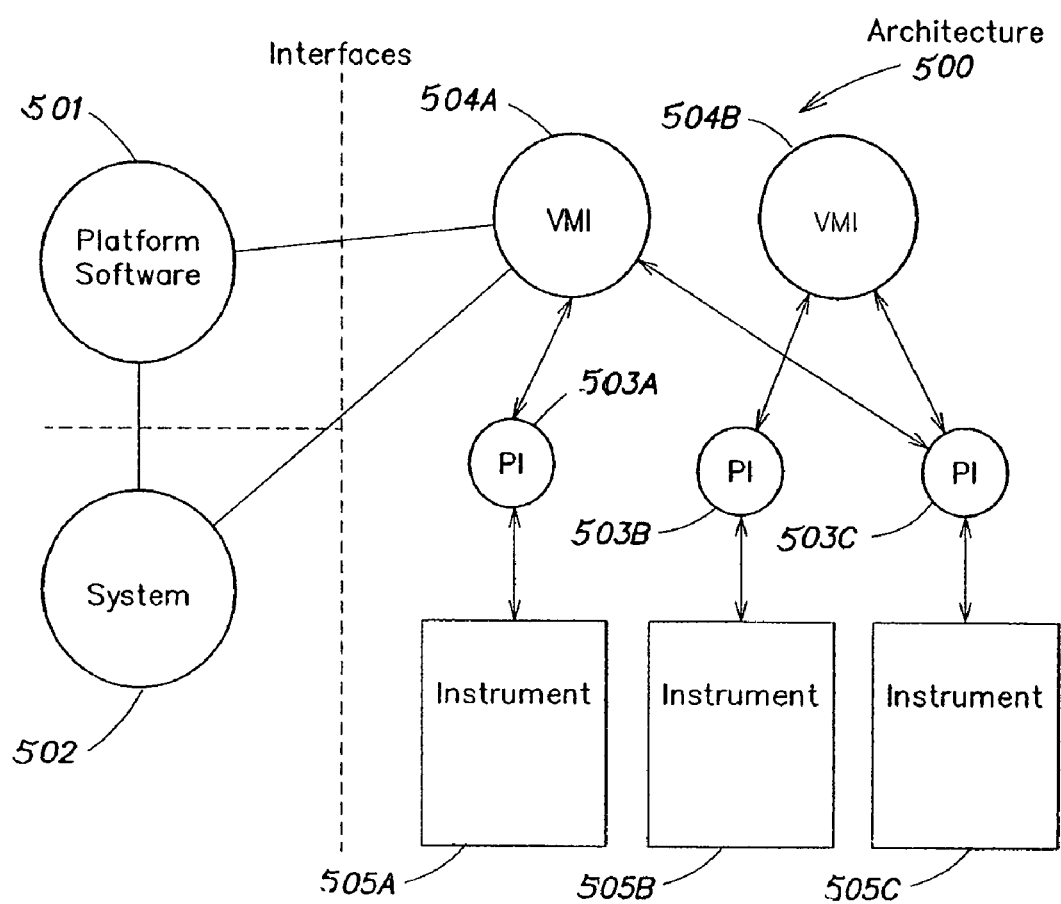
FIG. 5 is a block diagram of a test system architecture according to another embodiment of the present invention.

FIG. 5 shows a more detailed example of a test system architecture 400 according to one embodiment of the present invention. As discussed, an architecture 500 may include a platform software entity 501 that performs basic functions of the test system platform, and may be supported by a general purpose operating system such as, for example, the Windows XP or Windows Vista operating systems. In one embodiment of the present invention, a virtual representation of a particular test instrument is abstracted so that the functions and functionalities of any virtual instrument are segregated from the other abstraction layers of the test system. By isolating layers with well-defined programming interfaces, as discussed above, maintaining interfaces between versions of PIs, VMIs, etc., and their function locations in memory, test programs developed on the platform continue to function even if elements of the platform are modified.

According to another embodiment of the present invention, what is referred to herein as a virtual multisite instrument (VMI) is provided that facilitates management of multiple testing sites. In a traditional testing environment, it is appreciated that a site is managed as a singular entity in that if a particular testing site is configured, a test program is developed for the particular site, specific to the particular testing hardware used. If multiple sites are needed to perform additional testing (e.g., to satisfy an increased testing capacity), then additional test hardware configurations are purchased, and the test program is matriculated to the additional sites. According to one aspect of the present invention, because details of the underlying hardware is abstracted from test programs via an abstraction layer (e.g., a virtual instrument layer), test programs can be managed independent of test hardware, and the abstraction layer may be capable of managing the administration of a test program to multiple sites via the abstraction layer. In one embodiment, the virtual instrument may have capability to map to multiple instrument sites. In this way, the time needed to maintain and administer test programs to multiple sites is reduced.

In architecture 500, one or more virtual multisite instruments (504A, 504B) may be defined, and resources (e.g., one or more instruments or sites (505A-505C)) may be mapped to a virtual multisite instrument (VMI). Similar to virtual instruments, virtual multisite instruments communicate with instruments 505A-505C through one or more physical instrument driver programs (e.g., PIs 503A-503C). Similar to a virtual instrument, a virtual multisite instrument is not hardware implementation-specific, but rather, functionality is abstracted, and mapped to functions for particular hardware.

According to one embodiment, it should be appreciated that executing a test program on virtual instrument 504A, for example, the test program may be executed at multiple instrument sites (instruments 505A and 505C). A modification of the test program would, according to one embodiment, cause the test program to be updated at multiple sites, as a result of the abstraction of multiple sites into a single entity. Because of this capability, management of test programs on multiple sites is simplified.

According to one aspect of the present invention, the functionality of an ATE tester are abstracted in a series of abstraction layers as shown in FIG. 4. According to one approach, the test program layer represents an abstraction of the functions and functionality employed by the ATE tester to interact with a user (typically through test programs). In another aspect of the present invention, the physical instrument layer represents an abstraction of the hardware implementation details necessary to communicate with physical hardware instruments on the ATE tester. In another embodiment of the present invention, the functions of an ATE tester are broken down into a virtual instrument layer, that represents an abstraction of the functionality employed to map test requests from the test program layer to the physical instrument layer; a system layer, that represents an abstraction of the functionality employed by the physical instrument layer to communicate with the physical hardware it represents; and a platform layer, that represents an abstraction of the function and functionalities employed to provide a platform on which the other abstraction layers can operate. In another embodiment not shown in FIG. 4, the functions of an ATE tester are further abstracted into an interface layer, which represents an abstraction of the functionality employed to manage and standardize communication between the various abstraction layers. The layers shown in FIG. 4 will be discussed in greater detail below.

In a typical embodiment, an ATE tester is described with reference to abstraction layers that represent the functions of the ATE tester. In one embodiment, the abstraction layers form the basis for the system architecture. In one example, a test program forms a part of the test program layer. In another embodiment, a user interacts through the test program layer with the results of performed tests. In another example, a user may schedule test requests to be performed on specific instruments of the ATE tester, through the test program layer. It should be well understood by those of skill in the art that multiple test programs can easily be incorporated into the test program layer.

Platform Abstraction Layer

In another embodiment, the functionality provided by a conventional computer operating system is abstracted to be part of the platform layer. In one example, the platform layer is abstracted so that almost any operating system can be employed for use with an ATE tester. According to one aspect of the invention, the platform layer provides the basic functionality employed by the various components of the ATE tester to operate and communicate. In the example shown by FIG. 4, the platform layer forms the base of the architecture. In another embodiment, Windows XP is employed as the operating system that forms a part of the platform layer. In this instance, the operating system manages basic functions employed by the various ATE tester components.

In another embodiment, a library of C++ classes and C routines provide operating system services to the various components of the ATE tester. According to one embodiment, the library of C++ classes and C routines are part of the platform layer which allows for the use of almost any base operating system as part of the platform layer. In another embodiment, Windows XP and INtime operating systems provide the base functionality employed by the ATE tester, although it should be appreciated that any real time operating system or general-purpose operating system with real-time extensions may be used. Also, it should be appreciated by one skilled in the art that many programming languages and many class libraries can be employed to provide system services for the various components of the ATE tester, and the platform layer is not restricted to a library of C++ classes and C routines to provide operating system services.

In one example, the platform layer has the capability of providing deterministic function. In one embodiment of the invention, deterministic function is provided by employing an "off the shelf" operating system enhanced to be deterministic. For instance, Windows XP is employed as the off the shelf operating system, and is made deterministic by employing real-time extensions. In another embodiment, the INtime operating system provides the real-time extensions that make operations deterministic, however, it should be appreciated that any other real-time extensions may be used.

In a typical embodiment, the platform layer manages the operation of the other abstraction layers of the ATE tester.

Virtual Instrument Abstraction Layer

In one embodiment of the present invention, the functions of a particular test instruments are abstracted into a virtual representation so that their functions are segregated from the other abstraction layers of the test system. For example, the functions of one instrument can be represented in the virtual layer allowing other abstraction layers to access the instruments functionality through a virtualization. According to aspect of the present invention, communication with the virtualization can be standardized without being tied to any particular hardware implementation details. In a typical embodiment, the virtual instrument layer is further abstracted into virtual instrument modules ("VI modules") used to represent a virtualization of a group of instruments employed to test a device. According to one aspect of the present invention, a virtual instrument module can represent any number of physical pieces of hardware. In one embodiment, the VI module represents the functionality made available by the physical hardware of the ATE tester. In another embodiment, a user interfaces with a VI module through test programs, with the VI module managing the functions and function calls that cause any number of physical pieces of hardware to perform their respective test functions.

According to one aspect of the invention, the virtual instrument layer does not contain any hardware specific implementation details. Rather, in one example, the virtual instrument layer contains the functionality employed to call another abstraction layer that does contain specific hardware implementation details. The separation described in the example allows for the easy incorporation of additional instruments into a VI module. In another embodiment, when new hardware is added to a tester, the addition of new function calls that map to the abstraction layer that contains the specific hardware implementation details enables the tester to employ the new functionality. In another aspect of the present invention, new functionality may be added by creating a new virtual instrument module. It should be realized that by creating new virtual instrument modules, adding new functionality has no impact on the existing functions of the ATE tester. In one embodiment, virtual modules can represent various versions of software, allowing software versioning to take place on an ATE tester while assuring that older versions and functionality are not impacted. In one embodiment, a virtual instrument module is implemented as a dynamic link library. In yet another embodiment, the virtual instrument module may be implemented as a runtime system library (RSL).

Physical Instrument Abstraction Layer

In one embodiment, the physical instrument layer represents the abstraction of hardware specific implementation details of an ATE test system. In another embodiment, the physical instrument layer is further abstracted into physical instrument modules ("PI modules"). In one example, every piece of actual hardware is accompanied by a PI module that implements the basic functionality of that piece of hardware. The functionality made available by a particular piece of hardware is often referred to as a resource. In one embodiment consistent with the principles of the present invention, a PI module is implemented as a dynamic link library. Alternatively, the PI module may be implemented as an RSL.

According to one aspect of the present invention, the virtual instrument layer calls the physical instrument layer to access the specific hardware implementation details of the hardware installed in the ATE tester. In one embodiment, this is accomplished by a VI module calling a PI module to access the hardware specific details that the PI module represents. In one example, a PI module represents the specific hardware implementation details of a physical piece of hardware capable of providing clock synchronization signals to the ATE tester. In one embodiment, a VI module manages the function calls to the PI module that cause the physical piece of hardware to generate a clock synchronization signal.

Figure 6A:
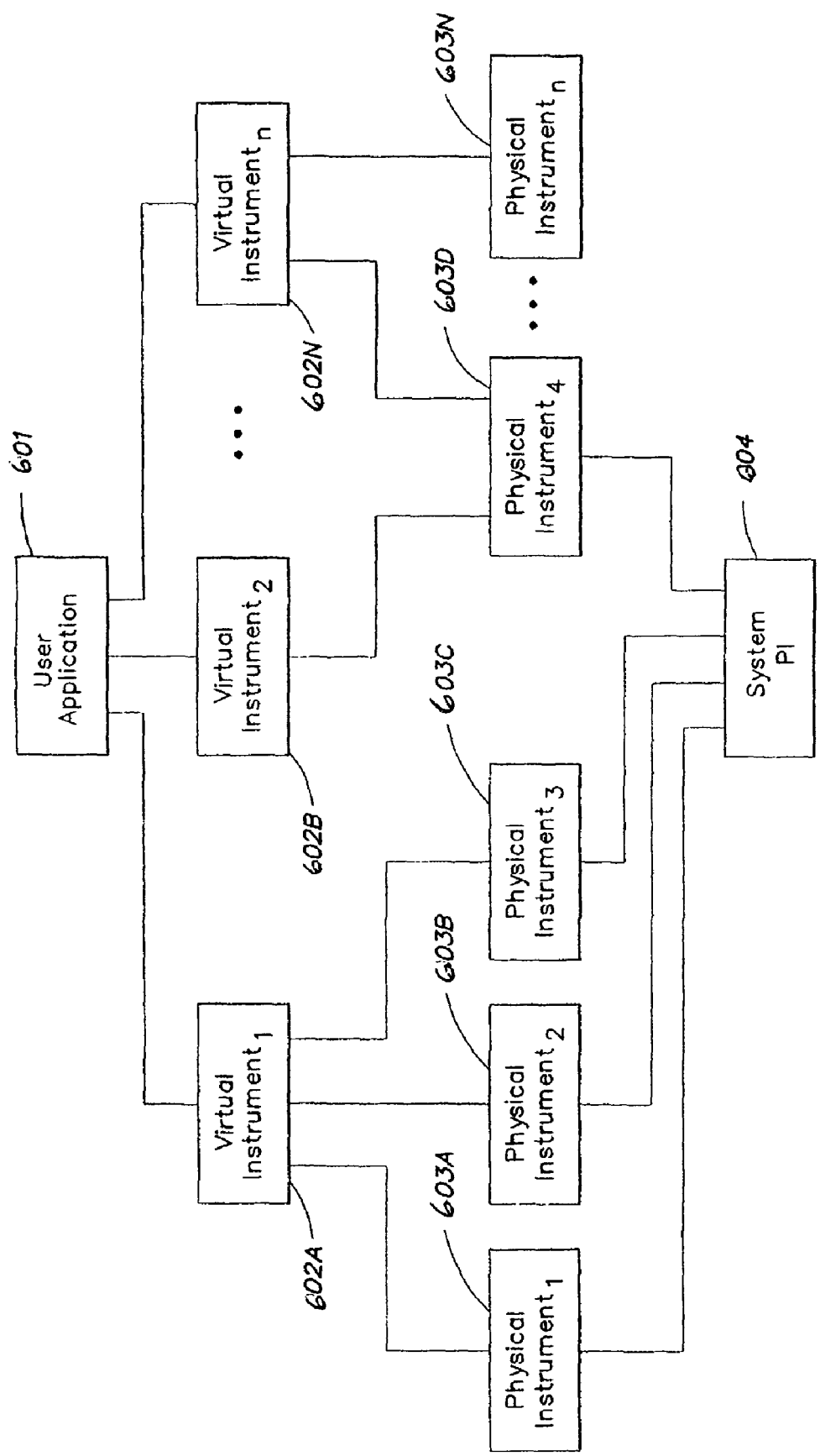
FIG. 6A is a block diagram of a test system architecture according to another embodiment of the present invention.
Figure 6B:
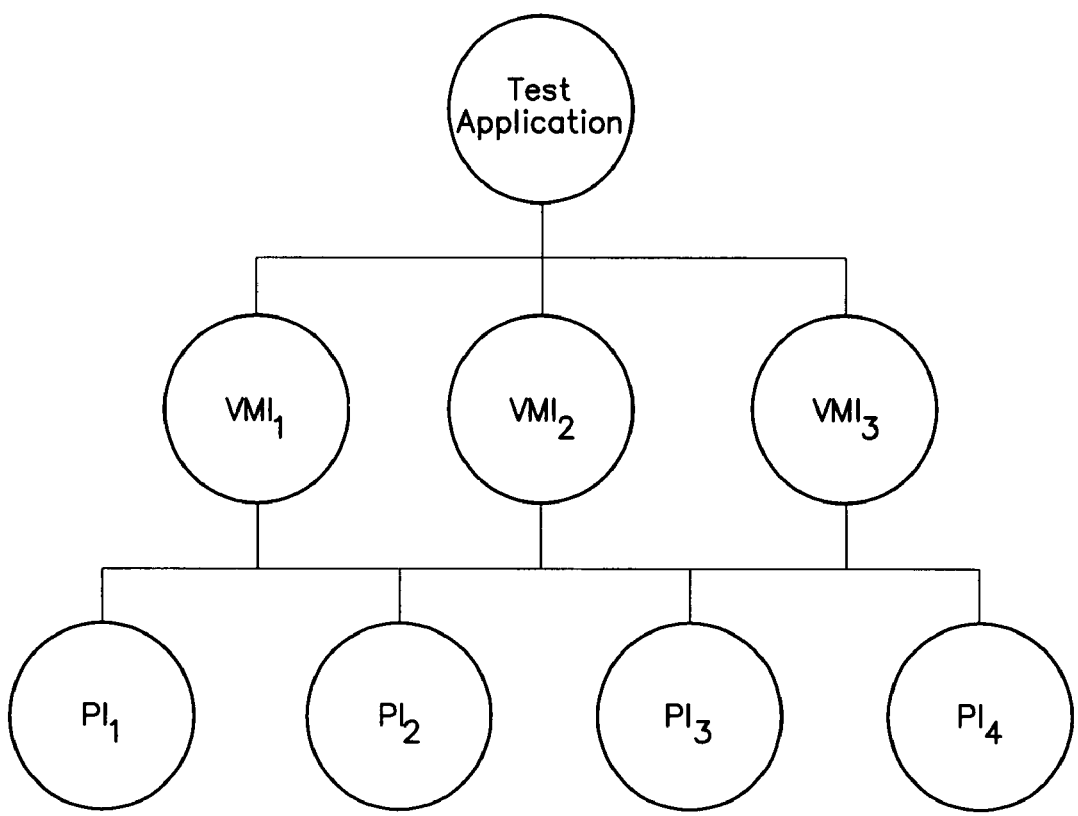
FIG. 6B is a block diagram of a test system architecture according to another embodiment of the present invention.

The interaction between the various abstraction layers can be seen in greater detail with reference to the exemplary FIGS. 6A and 6B. As these illustrations show, the test program layer (User application/Test Application) directs requests to VI modules of the virtual instrument layer (Virtual Instrument/VI), which in turn directs requests to PI modules of the physical instrument layer (Physical Instrument/PI).

FIG. 6A shows another example architecture showing an example test system architecture according to one embodiment of the present invention. A user application 601 accesses one or more Virtual Instruments (e.g., virtual instruments 602A-602N). As discussed, a virtual instrument may include any number of physical instruments (e.g., physical instruments 603A-603N). This permits, for example, the test system to implement functions that would otherwise be dispersed in the individual physical instruments.

In one implementation, the VMI has no specific knowledge of any actual hardware implementation. This knowledge resides with the "physical instrument module" (PI, e.g., physical instruments 603A-603N). According to one example implementation, each piece of actual hardware is accompanied by a PI module that implements all the basic functionality of that hardware. The VMI uses the functionality provided by one or more PIs to implement the functionality that will be presented to the user. In other embodiments, the VMI may have some knowledge, depending on the requirements of the test system developers and/or application.

According to one embodiment, PI modules themselves do not communicate directly to the hardware but rather through a "System PI" entity (e.g., system PI 604). System PI 604 implements functionality that allows the PI to communicate with the instruments that reside on the test head of the test system hardware. In another embodiment, a VMI may communicate directly to hardware through the System PI. In this embodiment, the VMI may also inform the PI of the communication so that the PI matches the hardware state as necessary.

It should be appreciated that FIGS. 6A-6B are presented by way of illustration and not by limitation. FIG. 6A, also incorporates one example interaction between the physical instrument layer and the system layer to be discussed further below.

In one embodiment, as can be seen from FIGS. 6A-6B, a VI module can incorporate a number of PI modules, and even share PI modules. According to one aspect of the present invention, by modularizing hardware resources into PI modules the present invention provides flexibility and adaptability for any tester based on this model. According to another aspect of the invention, new PI modules can be easily programmed in response to additional testing needs, and old PI modules can be leveraged in the design and fabrication of new testers. In one embodiment, a base class of function calls are provided that represent functionality typically employed for the testing of any device. In one embodiment, these base function calls can be incorporated into a PI Module and made available for use by test programs through a VI module.

System Abstraction Layer

According to one aspect of the present invention, the physical instrument layer does not communicate directly to physical pieces of hardware they describe. In one embodiment, a PI module passes requests, function calls, and/or data to the system layer. According to one aspect of the invention, the system layer represents an abstraction of the functions and functionality that allows the PI layer to communicate with the physical pieces of hardware (i.e. instruments) that are installed in the ATE tester.

Figure 6C:
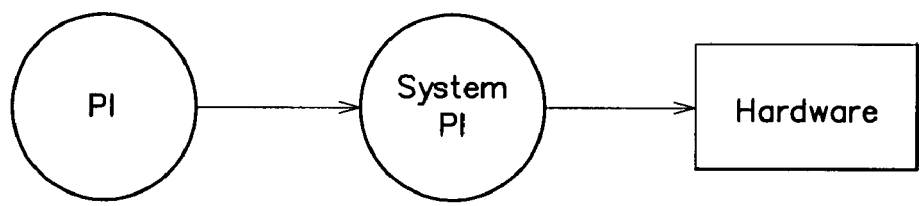
FIG. 6C is a block diagram of a test system architecture according to another embodiment of the present invention.
Figure 6D:
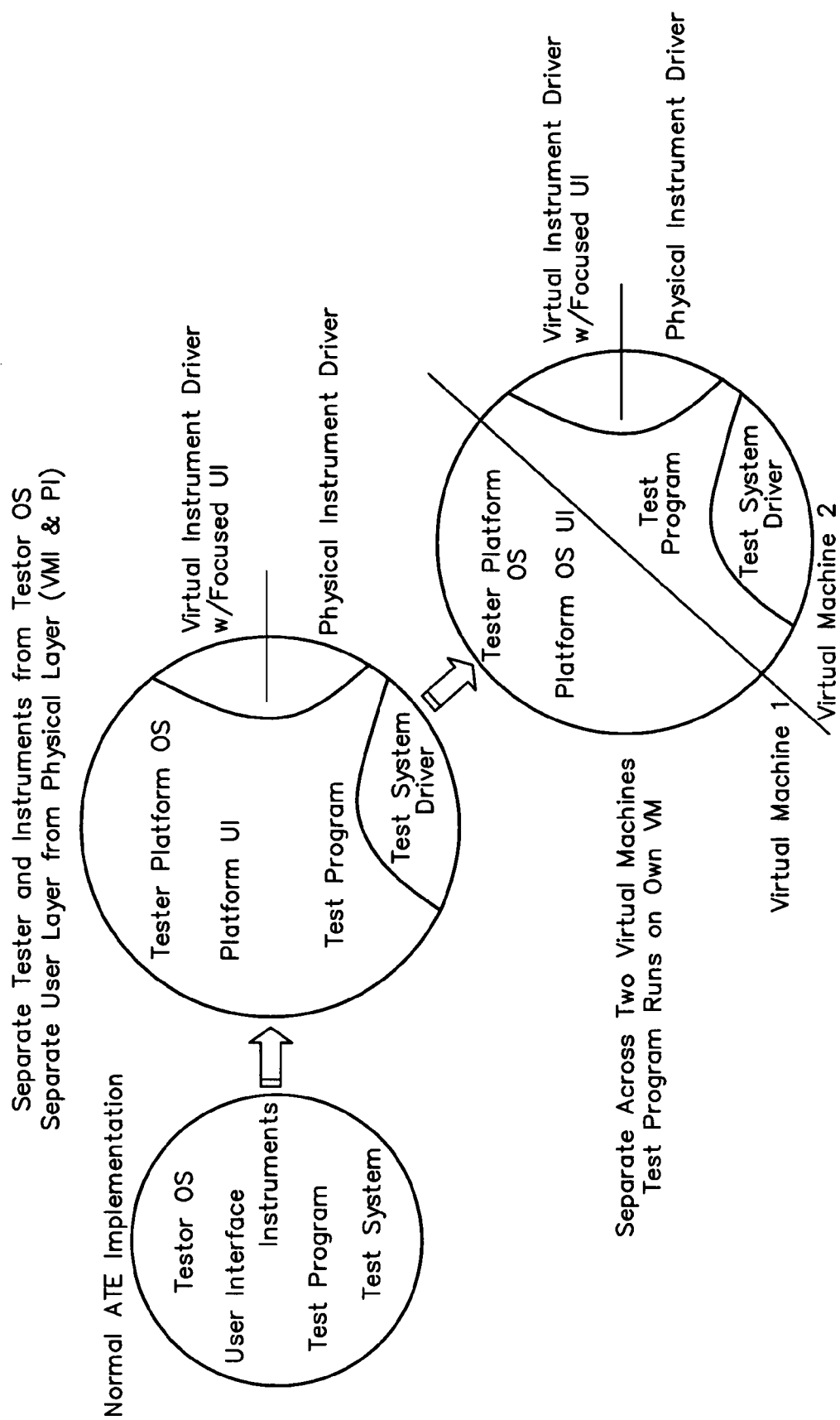
FIG. 6D is a block diagram of a test system architecture according to another embodiment of the present invention.

As can be seen from the example in FIG. 6C, a PI module of the physical instrument layer (shown as PI) communicates to the system layer (show as System PI) which maps calls to the physical hardware of the ATE tester. In one embodiment, the system layer includes a SystemPI module. According to another aspect of the present invention, the system layer represents an abstraction of the functionality employed to request and communicate information from other abstraction layers for reporting to the platform layer.

Interfaces

According to another aspect of the present invention, the functionality that manages passing of function calls, requests, and data transfers between the abstraction layers is also abstracted in an interface layer. In one embodiment of the invention, the interface layer includes the abstraction of the functionality used to manage communication in between and amongst the various other abstraction layers. In one embodiment, the interface layer manages the communication of function calls, the transfer of data, and any other communications between modules contained within each abstraction layer. According to one aspect of the present invention, the interface layer insures that communications between the various modules of the ATE tester occur in an expected format. It should be appreciated that by ensuring communications occur in an expected format, various modules will communicate in the same way regardless of the hardware implemented on any particular tester.

Virtual Machines

According to one aspect of the present invention, it is appreciated that there is a benefit from implementing various components of the tester system on one or more virtual machines. Such virtual machines, as known in the art, may be implemented as part of a virtual machine supported by one or more computer systems. Many different types of platforms support virtualization and virtual machines, and the invention is not limited to any particular one. One such type of system architecture that implements virtualization is shown by way of example in FIG. 6C.

According to one aspect of the present invention, it is appreciated that by separating functionality of the user layer (e.g., the tester interface) from the physical layer (e.g., the VMI and PI implementations), that more generalized hardware and software may be used for user layer components, or any other type of component that does not require specialized hardware and software. Because the system may be architected in this way, the cost for producing such a tester can be significantly reduced, as off-the-shelf hardware (e.g., PCs) and software (e.g., OSs) may be used instead of specialized components.

Further, it is appreciated that by separating user layer components (including, for example, test programs), that the tester platform OS and associated tester components may be modified without affecting user layer components. That is, if the tester interfaces presented to the user layer are maintained, the test program and other user layer components function consistently across changes. In this way, the user layer components such as test programs may be ported more easily among test systems having different system components such as software and hardware. Further, test programs that are developed on such systems are more useful over time, as they need not be reprogrammed and tested when the underlying hardware and software related to the test system needs to be changed. To this end, more than one virtual machine may be provided, at least one for user-level components and another that executes at least one component of the tester platform. As discussed previously, in a normal ATE implementation, the test system, test program and the associated components are developed and maintained as a single entity, requiring retest and certification upon the occurrence of the slightest changes. As a result, it is appreciated that normal ATE implementations are less flexible, require greater effort to maintain, and are less useful as a result.

Versioning

Figure 7:
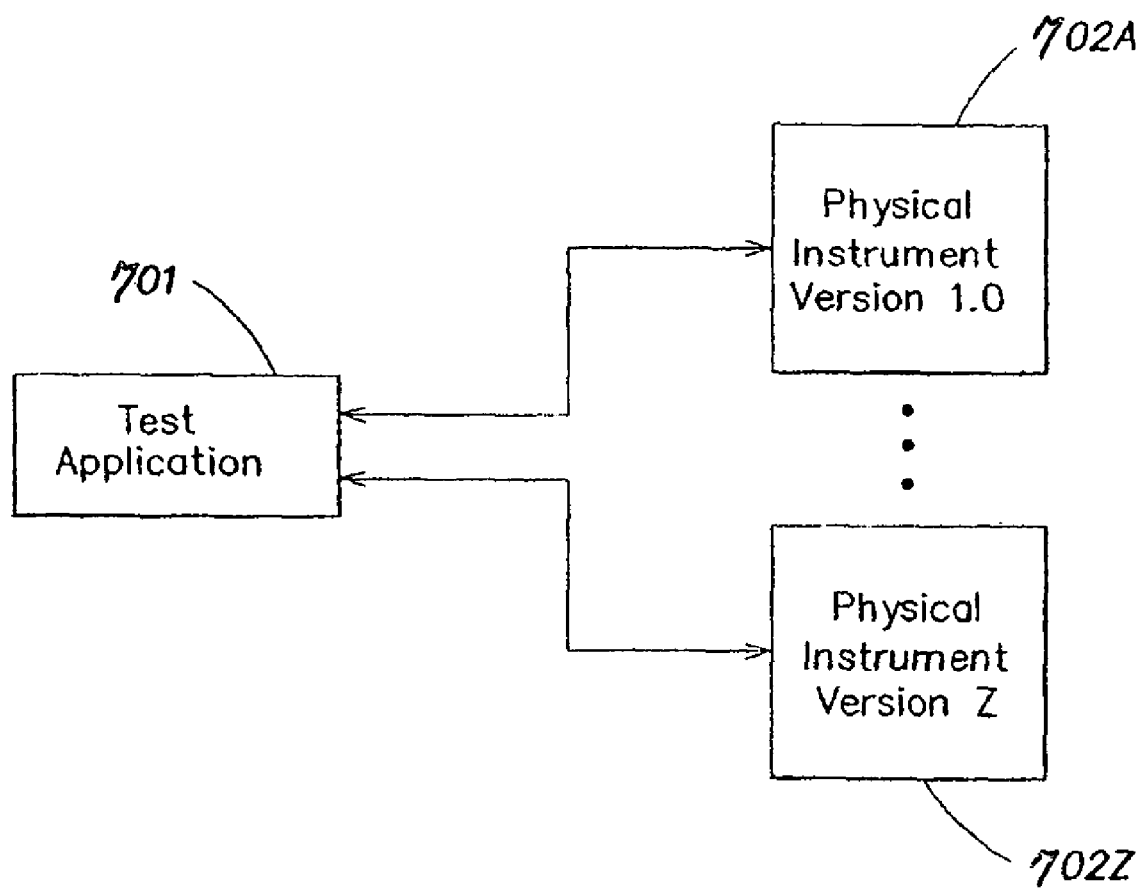
FIG. 7 is a block diagram of a test system platform according to one embodiment of the present invention.

FIG. 7 shows a block diagram of a test system platform according to one embodiment of the present invention illustrating changes in physical instrument versions. For example, a user may develop a test application 701 that is tailored to work with an example physical instrument version 1.0 (item 702A). At some time later, a physical instrument version may be made available that is different than an earlier version. For instance, physical instruments may have an additional capability that has been added in a later version of the hardware. Similarly, a physical instrument driver may be provided that includes a different interface to the new version of the physical instrument.

In one example, a physical instrument version 1.0 (702A) may, by default, produce an output voltage to a device under test of 5 volts. In a physical instrument version Z (item 702Z), the default value of the output voltage may be different (e.g., 64 volts). Because of this change, the test application 701 may not work in the manner indicated. Thus, according to one embodiment of the invention, a virtual instrument entity is provided that is independent of physical instrument versions, however, but is designed to support additional functionality as later hardware and driver software becomes available.

Similarly, if a new version of a software platform becomes available, it may be useful to use such a new version with one or more versions of a particular physical instrument. Indeed, in some testing configurations, there may be a need to mix multiple versions of physical instruments and test applications that are not configured to work together. According to one embodiment of the invention, a virtual instrument is provided that decouples test hardware from its associated software applications 301.

Maintaining Function References

According to one aspect of the present invention, a method for providing software functions is provided that permits compatibility across software and hardware versions. In one embodiment, functions of a virtual instrument are provided which remain unchanged between versions. More particularly, as functions are added to the virtual instrument, old functions are maintained, and functionality is added to a predetermined memory structure. Functionality to software modules are added without changing references to preexisting functions in memory. Because function references are unchanged, additional functionality, when added to the memory structure does not break existing connections.

According to one embodiment of the present invention, a virtual function table (e.g., in the C++ programming language, the well-known virtual method table "vtable")) is maintained for a virtual instrument. In one embodiment, in one version of the virtual instrument vtable, a base set of functionalities included having a defined location in the vtable. In a subsequent version of the virtual instrument table, additional functions are added to the vtable, while maintaining the same location of the vtable for the base set of functionality. In this way, functions and their connections to other software entities are maintained without breaking existing programs when additional functions are added. For instance, a base vtable may be followed by a derived vtable including the additional functionality. Although a vtable may be used as discussed below to maintain function references, it should be appreciated that other methods may be used to ensure function references are not broken (e.g., a function arbitration or tracking function).

Figure 8:
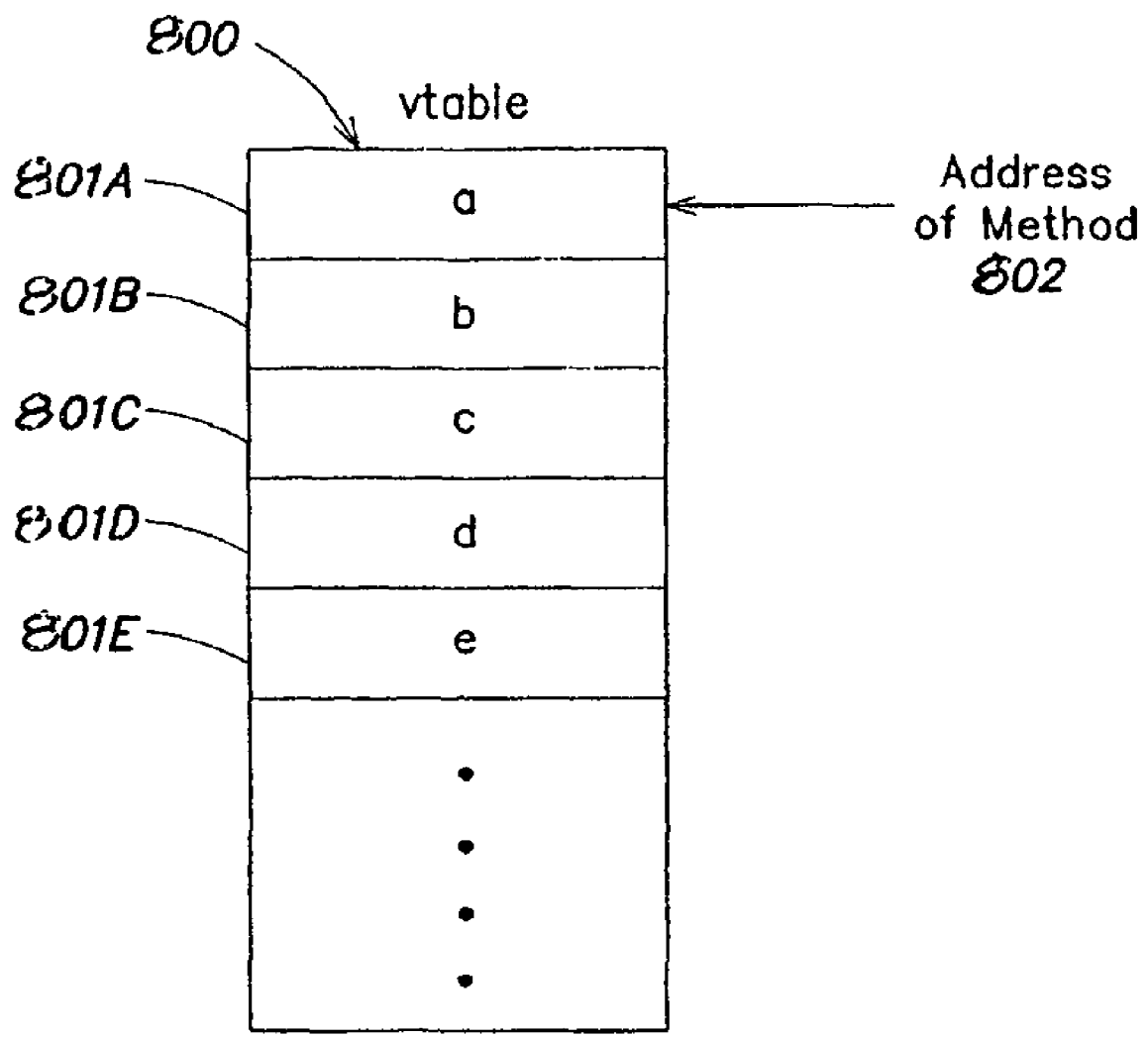
FIG. 8 is a block diagram of a memory structure which may be used to implement aspects of the present invention.

FIG. 8 shows a block diagram of a vtable memory structure which may be used to implement various aspects of the present invention. As shown, vtable 800 includes one or more methods 801A-801E which correspond to functions associated with particular instrument driver. In a conventional scenario when a particular function (e.g., method E (801E)) is modified, the behavior of the method changes, and thus any hardware or software that communicates using the function does not perform in the manner originally planned for in the earlier version. For example, if method E is called incorrectly, includes different default values, or returns data in a different format, the calling function will perform differently than expected. According to one aspect of the present invention, a memory structure is provided that permits software features to be added without breaking existing connections.

Example Versioning Architecture

Figure 9A:
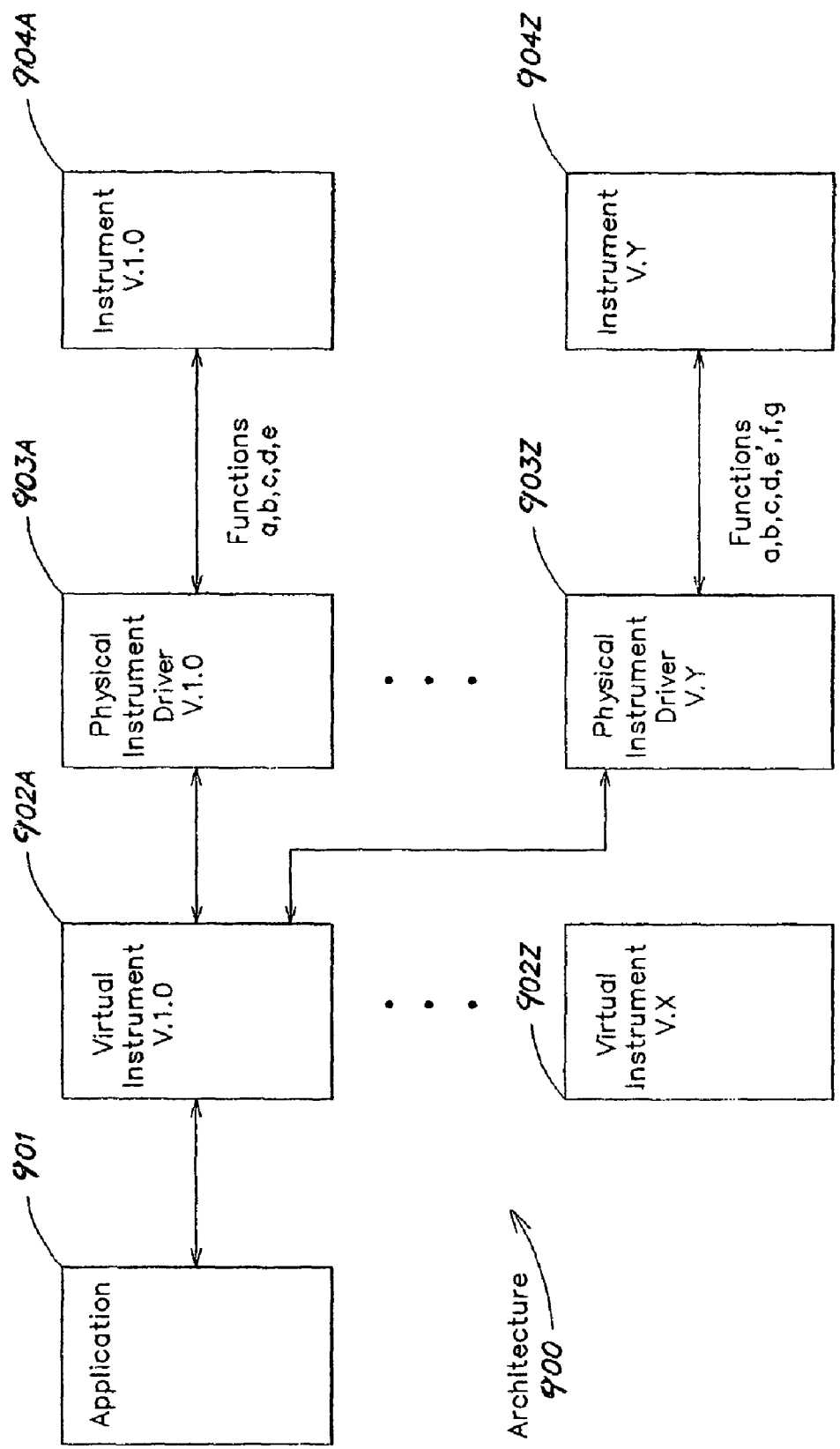
FIG. 9A is a block diagram of a test system architecture according to one embodiment of the present invention.

FIG. 9A shows one architecture 900 according to one embodiment of the present invention. In particular, application 901 may use one or more virtual instruments, each of which may have varying feature sets that facilitates software compatibility among software modules of a testing system. For instance, a virtual instrument V.1.0 (Item 902A) may be provided that is mapped to one or more physical instrument (PI) drivers. That is, a particular virtual instrument may be permitted to access one or more versions of a physical instrument driver.

Conventionally, when an instrument is added to a system, the driver associated with that new instrument replaces previous versions of the instrument driver. According to one aspect of the present invention, a method is provided wherein different version instruments may be used within the same test system, and are accessed via a single virtual instrument.

In one example, virtual instrument v.1.0 (item 902A) may be configured to communicate to instrument v.1.0 (item 904A) via physical instrument driver v.1.0 (item 903A) having a function set of elements [a, b, c, d, e]. Further, virtual instrument v.1.0 (item 902A) may be capable of communicating to instrument v.y (item 904Z) having functions set [a, b, c, d, e', f, g] using physical instrument driver v.y (item 903Z). Therefore, an application 901 may be capable, depending on the application, may use any version of an instrument and its associated driver without conflict.

Figure 9B:
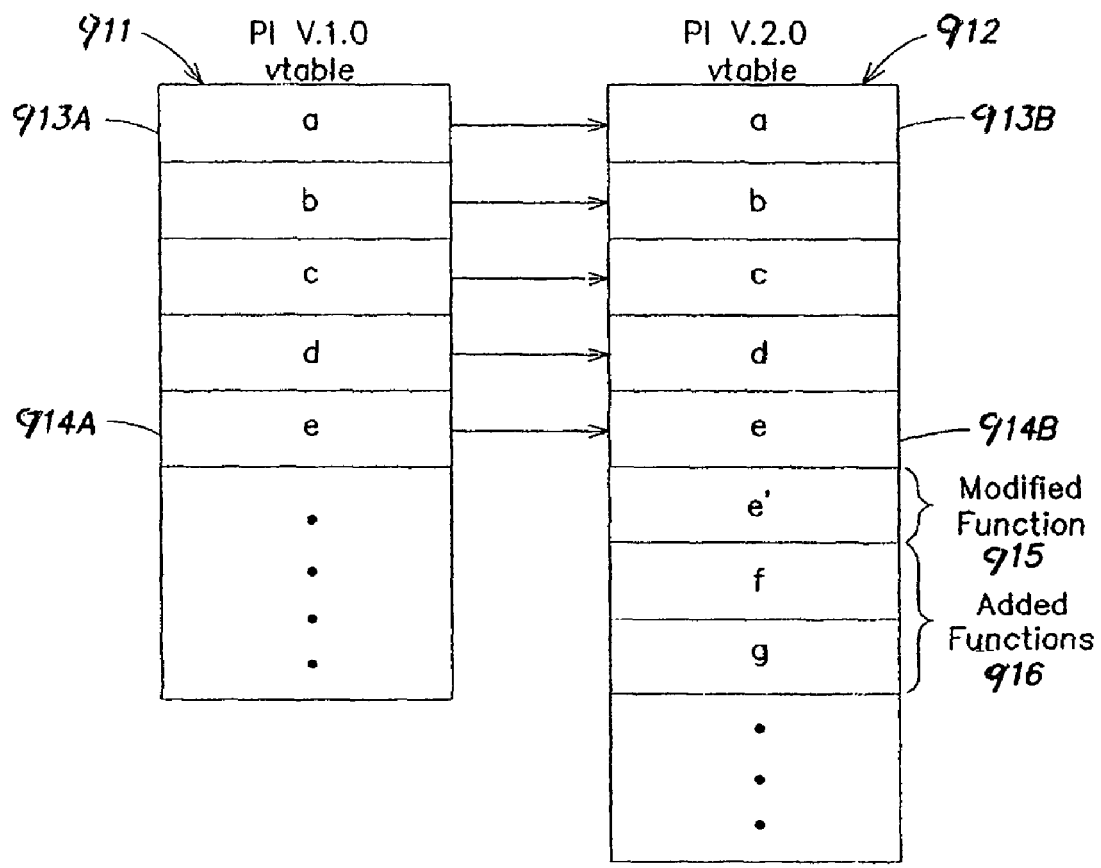
FIG. 9B is a block diagram of a memory structure according to one embodiment of the present invention.

FIG. 9B shows a block diagram of a memory structure according to one embodiment of the present invention. As discussed according to one aspect of the present invention, it may be beneficial to introduce additional hardware that may include one or more modified functions over previous functions or take advantage of additional functionality in nearly-introduced hardware and software. As shown in FIG. 9B, a vtable 901 associated with a physical instrument version v.1.0 includes one or more functions [a, b, c, d, e]. At a later point, a later version of a physical instrument is made available having a corresponding vtable 912 including functions set [a, b, c, d, e', f, g].

According to one aspect of the invention, a further version of the vtable associated with a physical instrument includes maintaining the same function references from previous versions to ensure that software that calls a particular function can locate that same function in the same location. So, for example, the function A (item 913A) is mapped to function A of the next version of the vtable, and is located in the same memory location. Further, in another example wherein a particular function is modified in the later version, the existing function (e.g., function E (item 914A)) is maintained in the same memory location in the later-version of the vtable. In this way, a newer version of a physical instrument may be added to the system without effecting existing software and applications that access the later version.

According to one aspect of the present invention, modified and/or added functionality is added to the following portions of the vtable so that the connections between old applications and newer versions of the physical instrument are maintained. According to one embodiment, these modified or added functions are added after previous versions functionality. For example, as shown in FIG. 9B, a modified function 915 e' is added after the original function 914B e. Further, as shown in FIG. 9B, additional functions f and g are added functions 916 which can be added after the base functions a through e. In this manner, functionality, whether changed or added, does not disturb existing references within the vtable. Because of this, existing connections between old applications and new versions of the physical instrument are not broken.

Further, it should be appreciated that a later version of a PI vtable may be used to access the same or previous versions of a particular instrument hardware by adhering to the conventions discussed above.

Figure 10:
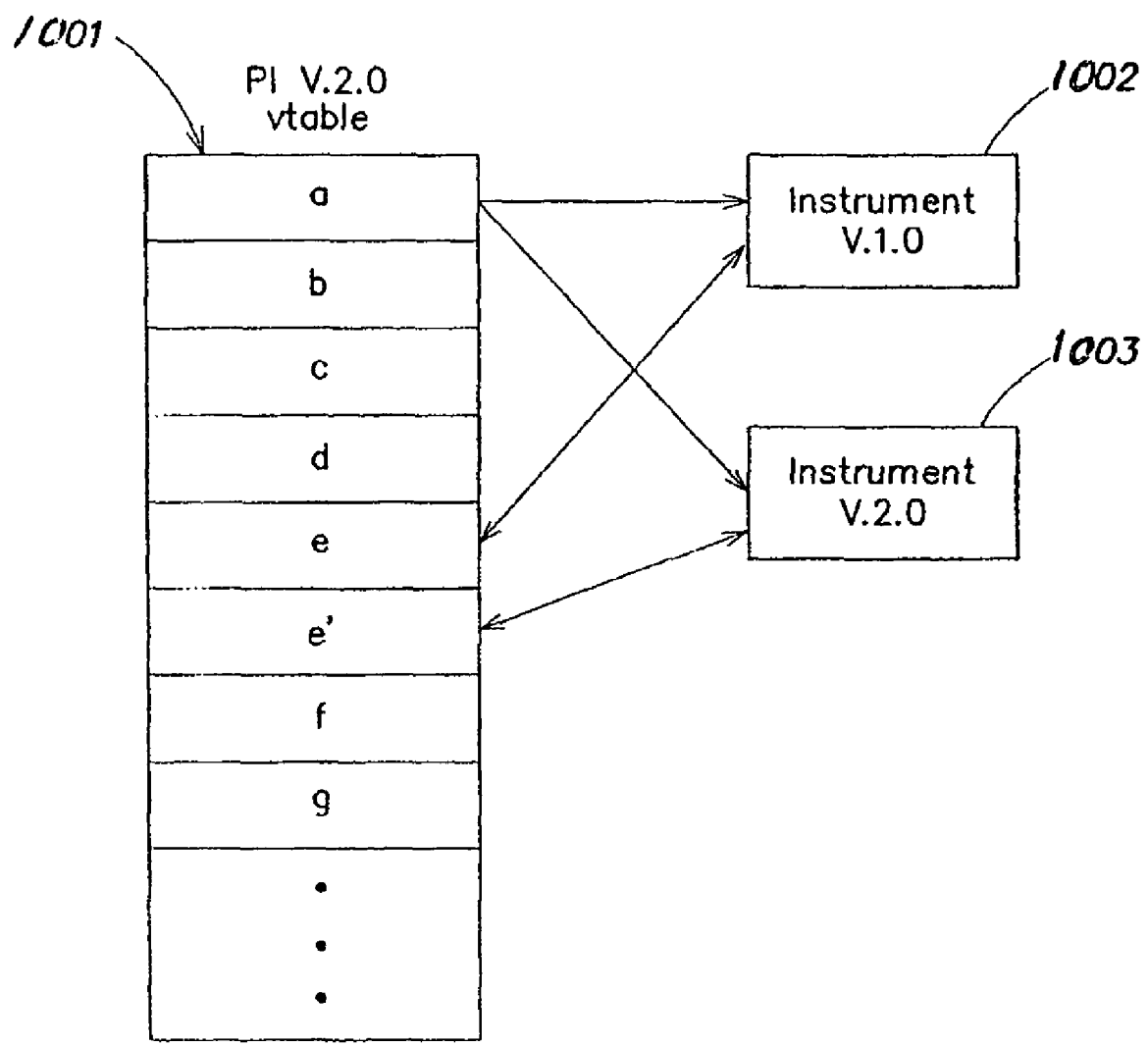
FIG. 10 is a block diagram of a memory structure according to another embodiment of the present invention.

FIG. 10 shows a block diagram of a memory structure according to another embodiment of the present invention showing how backwards compatibility is maintained using the program and conventions as described above. In particular, a version 2.0 of the PI vtable (item 1001) includes a number of methods including the set [a, b, c, d, e, e', f, g]. Because the later version of the vtable includes all of the functionality from previous versions of the PI, and their locations within the PI vtable are maintained, the later-version PI is capable of communicating with current and earlier versions of the instrument hardware. For instance, the method a, which is used by instrument version 1.0 (item 1002) and instrument version 2.0 (item 1003) are the same, and backward compatibility between the version 2.0 PI (item 1001) and previous versions of the instrument are maintained.

In the case where a new method is added in a later version of an instrument (e.g., instrument version 2.0 (item 1003)), according to one embodiment, that additional functionality is added to the end of the new version of the vtable. Therefore, in the example as shown in FIG. 10, previously-defined method e maps to instrument version 1.0 (item 1002) without breaking the communication between the new version of the PI vtable, while still supporting a modified method e' used for communicating with version 2.0 of the instrument (item 1003). As long as the VMI knows what to call (e.g., what version of PI to call (e.g., version number identified in abstract class)), then the connection between the elements will not break.

Such backward compatibility can be performed, for example, by providing an abstract class which is inherited by later classes that include the modified or added functionality. In this way, vtables are constructed such that the base data structure and associated methods include the same vtable function locations.

Therefore, in summary, for each successive revision of the software a standard vtable structure may be used which maintains the structure of a previous versions vtable. Because the structure is maintained, the applications or other programs that use the standard vtable structure can access newer and older methods as well as newer or older versions of hardware. However, it should be appreciated that other methods may be used for maintaining function references, and that a vtable need not be used.

Similarly, if a virtual instrument is revised to take advantage of newer functions, the same programming rules may be used to ensure that older versions of software (and therefore, hardware) can communicate with the virtual instrument version. For example, if a virtual instrument version X (item 902Z) is introduced, the virtual instrument version X will maintain the same vtable structure as previous versions, and in addition, may include additional functionality within the virtual instrument. Thus, certain functions provided in various versions of a virtual instrument may have forward and backward compatibility between different versions of physical interface drivers.

Figure 9C:
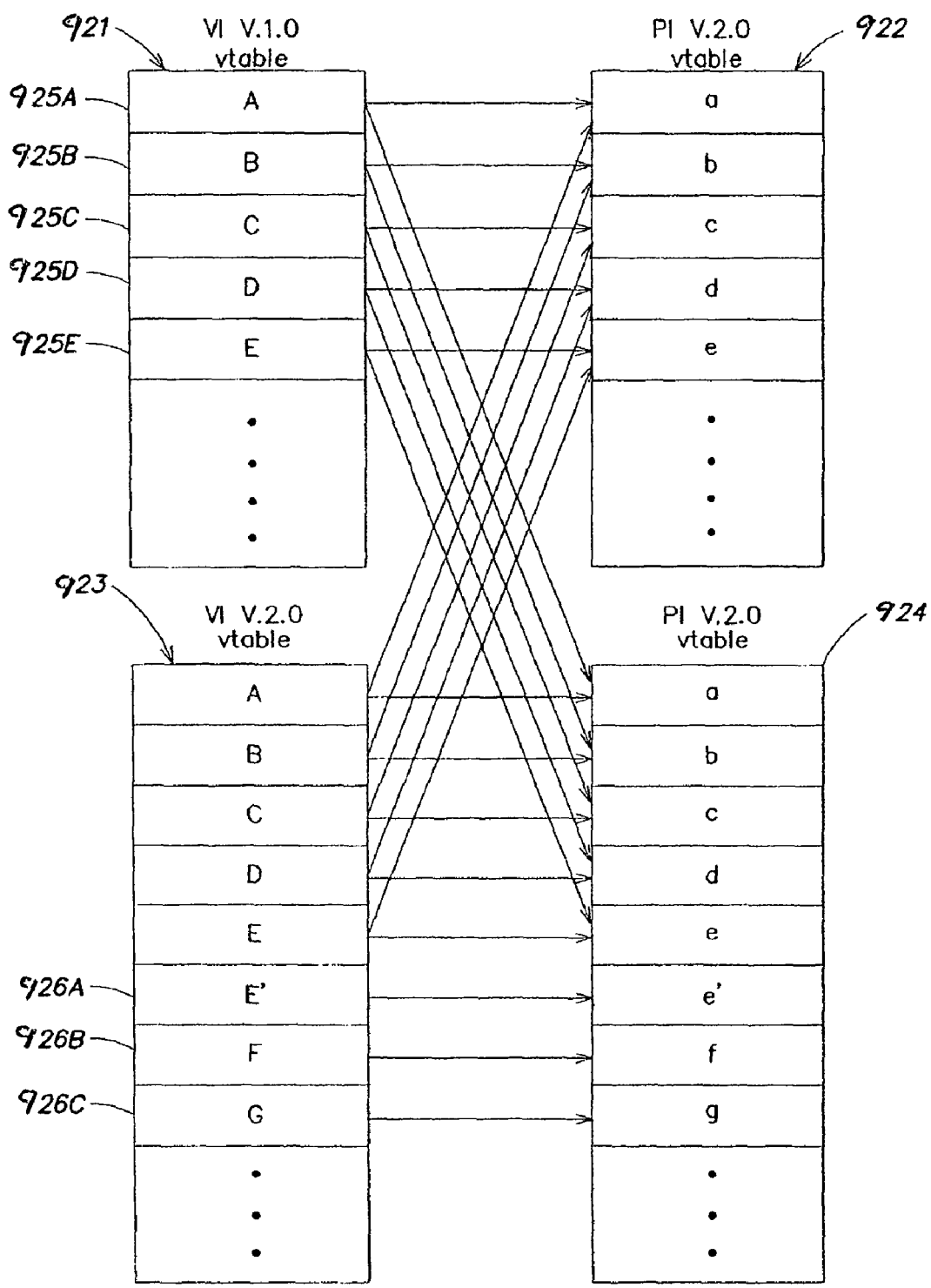
FIG. 9C is a block diagram of a memory structure according to another embodiment of the present invention.

As shown with particularity in FIG. 9C, a VI version 1.0 vtable (item 921) may be capable of accessing certain functions provided by various versions of a physical interface driver. A particular function created in the VI may call one or more functions in the PI that perform the higher-layer function of the VI. As shown, functions A-E (items 925A-925E) use functions a-e in either PI version 1.0 (item 922) or PI version 2.0 (item 924). In this way, a physical instrument driver may be replaced that is compatible with the virtual instrument methods, as function references are maintained within the vtable structure. Although a one-to-one mapping is shown between functions of the VI and PI, it should be appreciated that there may be other calling patterns between functions, and the shown mapping is provided to illustrate various aspects of the present invention and is provided for example only.

It can be shown that a later version of a vtable associated with a virtual instrument is compatible with both earlier versions of a physical instrument driver as well as later versions of a physical instrument driver. For instance, as shown in FIG. 9C, a modified method E' (item 926A) is added to the virtual instrument vtable which corresponds to e' function of version 2.0 of the physical instrument driver (item 924). For example, a new version of a VI may be provided that takes advantage of additional functionality in a later version of a physical instrument driver.

Further, in much the same way as changes made to a physical instrument driver, modified and/or additional functionality may be added to the end of the vtable structure such that original functionality is not modified. Thus, an older version of a physical instrument driver (e.g., PI version 1.0) is capable of working with a later version of the VI (e.g., version 2.0). That is, a later version of the VI may communicate with an earlier version of the PI. In this way, both forward and backward compatibility is maintained between software entities within the ATE system.

Programming Example

Instrument independence is an important feature of a test system architecture, according to one embodiment of the present invention. This feature allows independent improvements or modifications of each instrument without the need for coordinated simultaneous upgrades. In order to maintain this independence, the test system provides a system driver function via the system PI to manage the synchronization and triggering subsystem. In this scheme, the system PI acts as a mediator between instruments. The system PI manages the use and availability of signal lines, sets trigger connections and modes, and keeps delay information and does other housekeeping functions.

Starting with the user program or application (e.g., 901), the user program calls functions of the virtual multisite instruments (VMIs) which in turn call functions of the instrument physical drivers (or PIs). When PIs are created, they are provided access to the system PI for system level functions, calibration and the use of system resources (e.g., memory, trigger subsystem, etc.). The following discusses a practical example of a user program that accesses hardware through the test architecture shown in FIG. 10.

Consider a digital instrument resource mapped to a VMI called "Control" that generates a pulse when a pattern is run. The digital instrument is connected to a V/I resource which is mapped to a VMI called 'Vcc' that uses the instrument as a measurement strobe to measure the Idd current at that point in the pattern. The test code may look something similar to:

```
.
.
.
Control->ConnectTrigger(9,'Iddmeas');
Vcc->SetModeIMeasure(100ma);
Vcc->ConnectMeasStrobe('Iddmeas');
Control->RunPattern('mypat');
Wait(100ms);
Vcc->GetMeas(&Idd);
.
.
.
```

In the first line, Control->ConnectTrigger(9,'Iddmeas'); the VMI first makes a call to the resource mapped to it (the resource being in the PI) and the PI requests a connection of a specific Trigger Line to a Signal Line via the system PI for each site named 'Iddmeas[site]'. If they do not and sufficient signal lines are available, then the signal lines are reserved (by name) and the connection counter is set to 1, if the signal lines already exist the connection counter is incremented. In the event that there are insufficient signal lines available, an alarm may be generated. Upon successful reservation of signal lines, the VMI then instructs the Instrument PI(s) for each site to connect pattern bit 9 to the signal 'Iddmeas[site]'.

Each PI checks for an available trigger line and make the connection on board. The PI then requests the System PI to make the connection of its chosen trigger line to the signal named 'Iddmeas[site]'. The Instrument PI does this by sending information to the System PI as to its location, trigger line selected and direction of the connection (in this case Asynchronous Dive) and the signal to be connected to. The system PI sets the appropriate connection in the cross-point function and set the mode for the selected trigger line. Now we have pattern bit 9 driving the signal line named 'Iddmeas[site]'.

In the second line, the VMI called Vcc is set to current measure mode on the 100 ma range. In the third line, the VMI called Vcc is instructed to set the measurement strobe to trigger mode and connect the strobe to the signal named 'Iddmeas' in receive mode. This may be accomplished, for example, by having the Vcc VMI making a call to the System PI to reserve the Signal lines but since they were already reserved, the connection counter may be simply incremented. Then the Vcc VMI calls the individual instrument PIs to make the connection.

The VMI instruments makes the connection of the strobe to an available trigger line on-board and request the System PI to connect the selected trigger line to 'Iddmeas' in Asynchronous Receive mode.

Next, the pattern is run and the measurement is stored on the board. This may be followed by a delay and then the measurement(s) are retrieved. The connections persist and can be used in subsequent tests so it is not necessary to re-program the connection if the connection is needed again. A situation may arise where there are no longer enough signal lines available for use in subsequent tests. In this case, a Disconnect function may be used to free up signal lines that are no longer needed. The system PI may maintain a count of connections and any disconnect function call from a VMI will be honored if the count is zero. To free up 'Iddmeas' in the example, the following lines may be added:

```
Control->DisconnectTrigger(9,'Iddmeas');
Vcc->DisconnectMeasStrobe('Iddmeas');
```

In the first line above, the Digital VMI 'Control', may instruct the instrument PIs to disconnect, The PIs request the disconnect from the System PI, Then the Control VMI requests the disconnect of the Signal named 'Iddmeas'. The system PI decrements the connection counter but does not free up the signal lines because a connection still exists. In the second line above, the Vcc VMI similarly instructs the instrument PIs to disconnect, then request a disconnect from the system PI. In this instance the System PI decrements the connection counter to zero and de-allocate the signal line for later use.

According to one embodiment, the System PI manages the resources (signal lines) in a robust way. For example, all signal lines may be de-allocated at program load and at start of test. Also, since tools might be able to control connection state and users may quit at breakpoints etc., signal lines should not be locked out in error.

By use of this example, a basic connection scheme is performed between two instruments. As can be seen, the instrument function in no way depends on the implementation of the function in the instrument to which it is connecting. A drawback of this scheme is that there are two lines of user code needed to make a connection. However, the architecture provides the ability for multiple instruments to connect to a single source.

Figure 11:
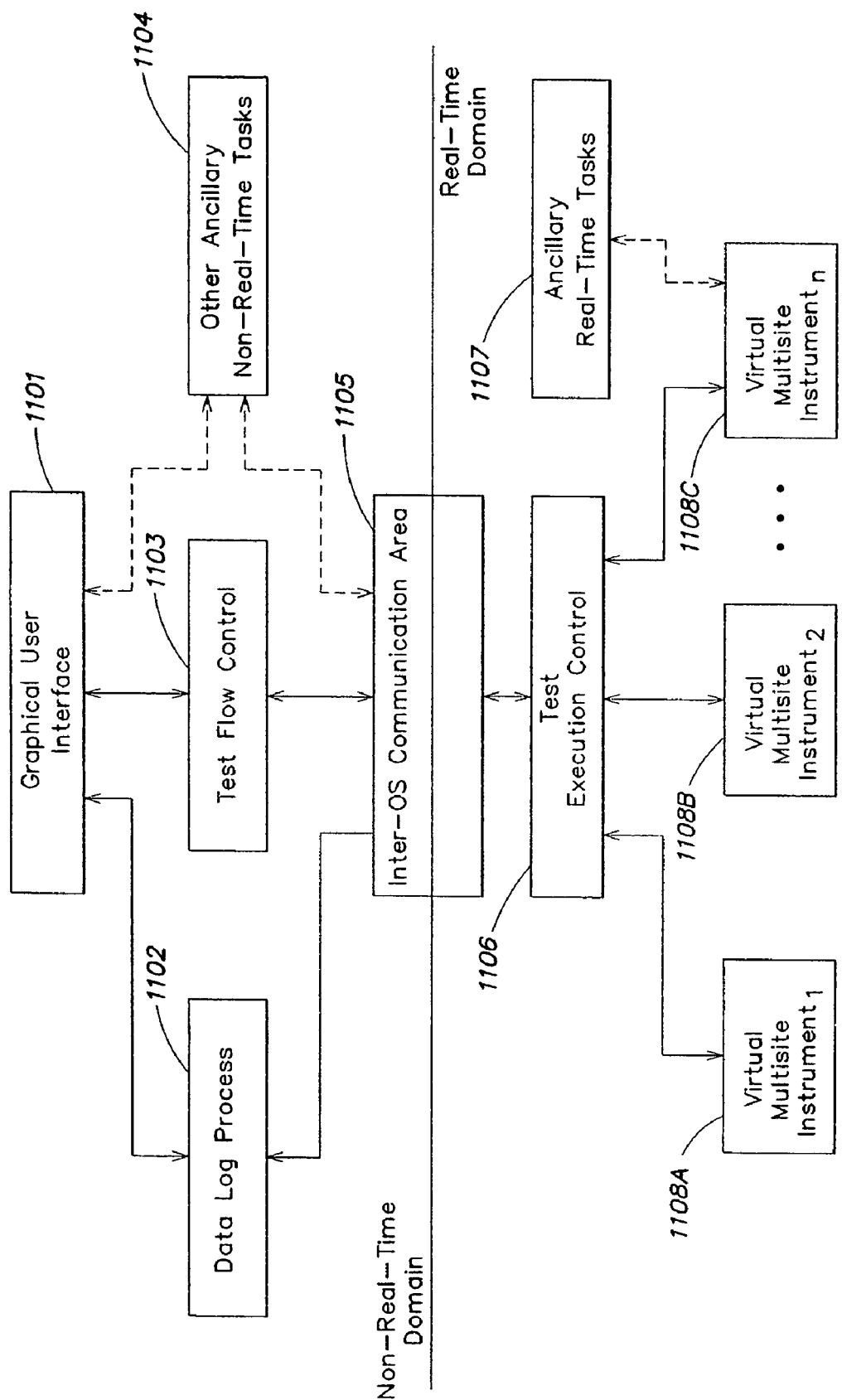
FIG. 11 is a block diagram of a test system architecture according to another embodiment of the present invention.

FIG. 11 shows another example of a test system architecture which may be used to implement various aspects of the present invention. Deterministic operation is one basic requirement to achieve a high level of repeatability in test applications. By reducing the jitter associated with the execution time of individual tests in a test application, measurements made across multiple devices will be much more consistent and accurate. The ATE industry has solved this problem by using dedicated processors running real-time operating systems to execute individual tests. The drawback with this approach is that deterministic operation is achieved at a very high cost.

This creates a problem for low-cost test systems where usually only a single processor is available to control all tasks relating to a test environment (e.g., user-interface, datalogging, test execution, etc.). To complicate matters even further, the availability of real-time operating systems (RTOSs) for low-cost platforms is relatively small and these operating systems are not tailored to provide users with friendly and "nice-looking" user-interfaces. Usually the interface provided by these RTOSs is text-based and generally based on very cryptic commands for the lay user.

FIG. 11 shows an example architecture that includes both real-time and non-real time components. For example, the architecture may include a graphical user interface 1101 which is used by the user to perform and maintain test programs. Further, the architecture may include a data log process 1102 that stores test results retrieved from devices under test (DUTs). Further, the system may include a non-real-time function 1103 that performs flow control relating to executed test procedures. Further, the architecture may perform any number of non-realtime-tasks 1104 relating to testing, such as reporting, alarms, or other tasks.

In one embodiment of the present invention, real-time and non-real-time components may be implemented on separate virtual machines. These separate virtual machines may be, for example, executed on the same or different processors as is known in the art. The virtual machines may perform inter-virtual machine communication to implement various distributed functionality. According to one aspect, by implementing non-real-time components on a separate system entity (e.g., a separate virtual machine), the cost of such a system may be reduced, as off-the-shelf hardware and software may be used to implement such non-real-time components.

Further, the architecture provides real-time processes for performing functions relating to testing one or more DUTs. For instance, a test execution control component 1106 may be provided that governs the execution of test functions on the one or more DUTs. The system may have defined one or more virtual multisite instruments (e.g., VMIs 1108A-1108C) that can be used to implement one or more test programs provided by a user. Also, the architecture may include other ancillary real-time tasks 1107 that are performed to support the testing procedures. Such tasks may include, for example, signaling or other time-dependent tasks.

To facilitate communication between real and non-real-time processes, an inter-OS communication area 1105 (or an inter-virtual machine communication area in the case of using separate virtual machines) may be provided which allows real-time tasks to communicate with and access resources in the non-real-time domain.

Although the Windows XP operating system has a well-known graphical user interface, the Windows XP operating system is not a real-time operating system. This basically means that the Windows XP operating system cannot guarantee that a particular operating system request will be serviced in a particular amount of time, or that tasks running under the operating system are guaranteed to execute in a predetermined period of time. According to one embodiment, the Windows XP operating system may be modified to allow the operating system (or any other operating system) to provide real-time capabilities.

According to one embodiment of the present invention, Tenasys real time extensions (INtime extensions product) may be used, but it should be appreciated that other types of extensions or any other real-time operating system (RTOS) may be used. Tenasys offers a solution that provides the ability to run two completely different operating systems in a single processor while allowing communication between the two OSs. Tenasys technology that allows both operating systems to run on an x86 platform without interference. This technology also guarantees that failures (even catastrophic failures) in one environment do not cause any side effects on the other environment. This allows for a very high degree of reliability.

The INtime product provides a real-time environment in which the Windows NT operating system itself is a low-priority task. This way all real-time tasks take precedence over Windows NT operating system so it is possible to guarantee consistent execution times regardless of any activity in the Windows environment. According to one embodiment, the test system architecture relies on a real-time environment where all time critical tasks are executed and a non-real-time environment where relatively low-priority tasks will execute. Both of these operating system environments would share a single processor system and communicate with each other when necessary.

According to one embodiment of the present invention, a test architecture may be adapted to perform deterministic processing as discussed in U.S. patent application Ser. No. 11/218,915 filed Sep. 2, 2005, entitled "SYSTEM AND METHOD FOR PERFORMING DETERMINISTIC PROCESSING", the contents of which are incorporated herein by reference. However, it should be appreciated that other operating systems may be used with real-time capabilities, and the invention is not limited to any particular type of operating system.

General Purpose Computer System

Various embodiments according to the present invention may be implemented on one or more computer systems. These computer systems may be, for example, general-purpose computers such as those based on Intel PENTIUM-type processor, Motorola PowerPC, AMD Athlon or Turion, Sun UltraSPARC, Hewlett-Packard PA-RISC processors, or any other type of processor. It should be appreciated that one or more of any type computer system may be used to perform processing according to various embodiments of the invention. Further, the system may be located on a single computer or may be distributed among a plurality of computers attached by a communications network.

A general-purpose computer system according to one embodiment of the invention is configured to perform any of the described functions, including but not limited to, performing processing associated with a test program. It should be appreciated that the system may perform other functions, and the invention is not limited to having any particular function or set of functions.

Figure 12:
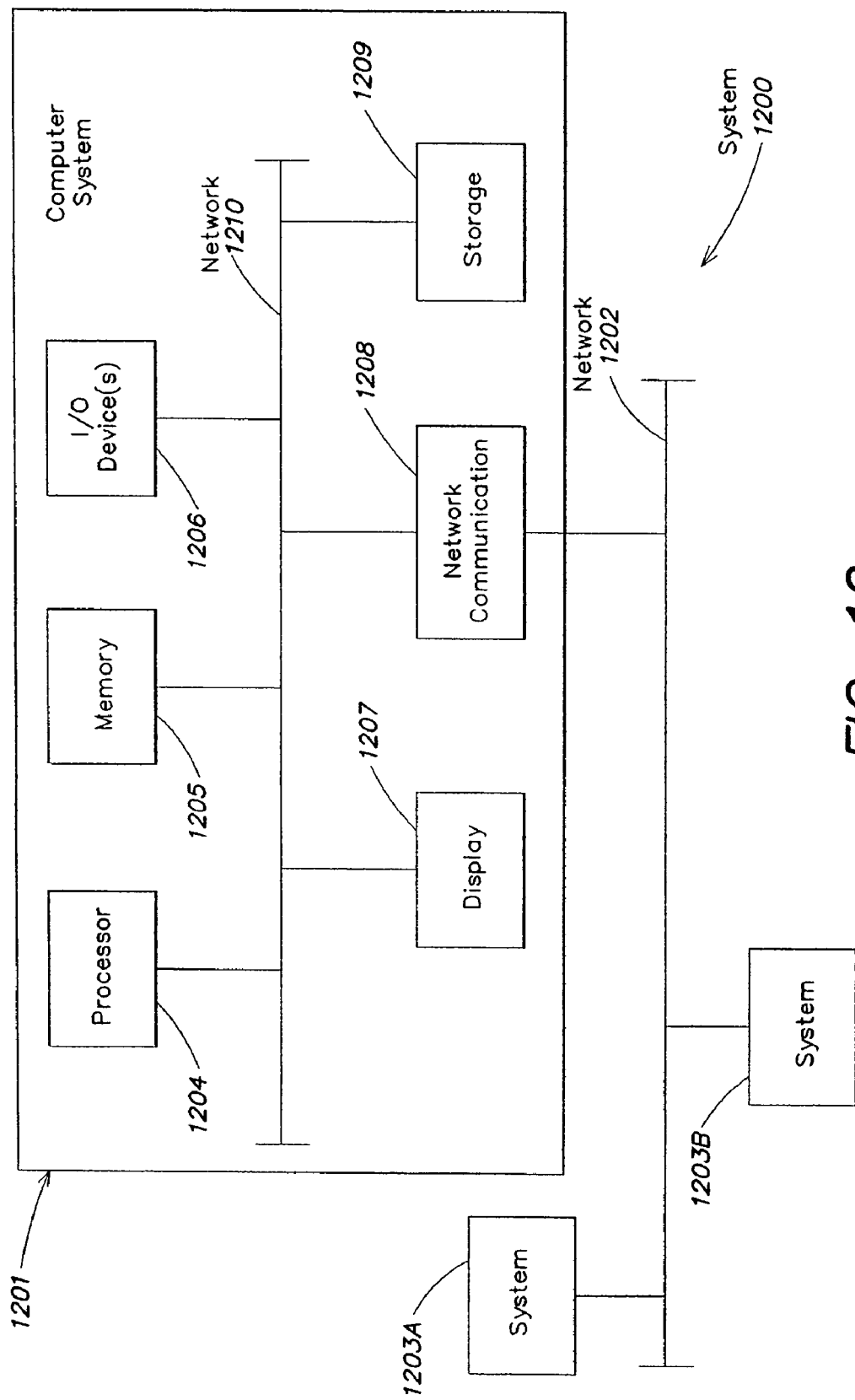
FIG. 12 is a block diagram of a general-purpose computer system with which various aspects of the present invention may be practiced.

FIG. 12 shows a block diagram of a general purpose computer and network system in which various aspects of the present invention may be practiced. For example, various aspects of the invention may be implemented as specialized software executing in one or more computer systems including general-purpose computer system 1201 shown in FIG. 12. Computer system 1201 may include a processor 1204 connected to one or more memory devices 1205, such as a disk drive, memory, or other device for storing data. Memory 1205 is typically used for storing programs and data during operation of the computer system 1201. Components of computer system 1201 may be coupled by an interconnection mechanism such as network 1210, which may include one or more busses (e.g., between components that are integrated within a same machine) and/or a network (e.g., between components that reside on separate discrete machines). The interconnection mechanism enables communications (e.g., data, instructions) to be exchanged between system components of system 1201.

Computer system 1201 also includes one or more input/output (I/O) devices 1206, for example, a keyboard, mouse, trackball, microphone, touch screen, a printing device, display screen, speaker, etc. In addition, computer system 1201 may contain one or more interfaces (e.g., network communication device 1208) that connect computer system 1201 to a communication network (in addition or as an alternative to the network 1210.

The storage system 1209, typically includes a computer readable and writeable nonvolatile recording medium in which signals are stored that define a program to be executed by the processor or information stored on or in the medium to be processed by the program. The medium may, for example, be a disk or flash memory. Typically, in operation, the processor causes data to be read from the nonvolatile recording medium into another memory that allows for faster access to the information by the processor than does the medium. This memory is typically a volatile, random access memory such as a dynamic random access memory (DRAM) or static memory (SRAM). The memory may be located in storage system 1209, as shown, or in memory system 105. The processor 104 generally manipulates the data within the integrated circuit memory 104, and then copies the data to the medium associated with storage 1209 after processing is completed. A variety of mechanisms are known for managing data movement between the medium and integrated circuit memory element and the invention is not limited thereto. The invention is not limited to a particular memory system or storage system.

The computer system may include specially-programmed, special-purpose hardware, for example, an application-specific integrated circuit (ASIC). Aspects of the invention may be implemented in software, hardware or firmware, or any combination thereof. Further, such methods, acts, systems, system elements and components thereof may be implemented as part of the computer system described above or as an independent component.

Although computer system 1201 is shown by way of example as one type of computer system upon which various aspects of the invention may be practiced, it should be appreciated that aspects of the invention are not limited to being implemented on the computer system as shown in FIG. 12. Various aspects of the invention may be practiced on one or more computers having a different architectures or components that that shown in FIG. 12.

Computer system 1201 may be a general-purpose computer system that is programmable using a high-level computer programming language. Computer system 1201 may be also implemented using specially programmed, special purpose hardware. In computer system 1201, processor 1204 is typically a commercially available processor such as the well-known Pentium class processor available from the Intel Corporation. Many other processors are available.

Such a processor usually executes an operating system which may be, for example, the Windows-based operating systems (e.g., Windows NT, Windows 2000 (Windows ME), Windows XP, Windows Vista operating systems) available from the Microsoft Corporation, MAC OS System X operating system available from Apple Computer, the Solaris operating system available from Sun Microsystems, UNIX operating systems available from various sources, INtime and Tenasys as mentioned above, among others. Many other operating systems may be used, and the invention is not limited to any particular operating system or operating system extensions to perform any real-time or non-real-time functions according to various embodiments.

The processor and operating system together define a computer platform for which application programs in high-level programming languages are written. It should be understood that the invention is not limited to a particular computer system platform, processor, operating system, or network, unless specified by one or more claims. Also, it should be apparent to those skilled in the art that the present invention is not limited to a specific programming language or computer system. Further, it should be appreciated that other appropriate programming languages and other appropriate computer systems could also be used.

One or more portions of the computer system may be distributed across one or more computer systems coupled to a communications network. These computer systems also may be general-purpose computer systems. For example, various aspects of the invention may be distributed among one or more computer systems (e.g., servers) configured to provide a service to one or more client computers, or to perform an overall task as part of a distributed system. For example, various aspects of the invention may be performed on a client-server or multi-tier system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP).

It should be appreciated that the invention is not limited to executing on any particular system or group of systems. Also, it should be appreciated that the invention is not limited to any particular distributed architecture, network, or communication protocol.

Various embodiments of the present invention may be programmed using an object-oriented programming language, such as SmallTalk, Java, C++, Ada, or C# (C-Sharp). Other object-oriented programming languages may also be used. Alternatively, functional, scripting, assembly language, and/or logical programming languages may be used. Various aspects of the invention may be implemented in a non-programmed environment (e.g., documents created in HTML, XML or other format that, when viewed in a window of a browser program, render aspects of a graphical-user interface (GUI) or perform other functions). Various aspects of the invention may be implemented as programmed or non-programmed elements, or any combination thereof.

Various aspects of this system can be implemented by one or more systems within system 100. For instance, the system may be a single or multiprocessor system. In one example, the system includes software processes executing on a system such as a personal computer (PC). Such a system, for example, may permit the user to perform one or more functions in a test system that tests a device under test (DUT). Such systems may include, for example, test systems, control systems, among others.

Example Client-Server Architecture

According to another aspect of the present invention, it is appreciated that test programs software is used by different types of user—some users develop test applications, and others use the developed applications for the administration and management of test processes. However, these separate types of users may need to use a specific user interface (UI), depending on what functions are performed. It is appreciated that multiple types of testers have different user interfaces, forcing the user to understand the specific type of interface necessary to run the equipment. Also, it is appreciated that in the ATE industry, the application and drivers are tightly coupled, and the user interfaces are tied to the system software. According to one aspect of the present invention, a standard user interface may be used to access multiple tester types, reducing the amount of training necessary for the user. To further reduce the amount of training required, a user-specific interface is provided that allows the user to perform testing functions related to their role.

Further, according to another aspect of the present invention, a testing architecture is provided that permits a user to perform testing functions from any location. In one specific implementation, the user interface is accessed through a browser program, and a user may perform testing functions from any location coupled to a testing system through a communications network. In a traditional environment, the UI is normally tied to the machine, however, if the UI is made available over a network, the user can perform testing from another location.

Figure 13:
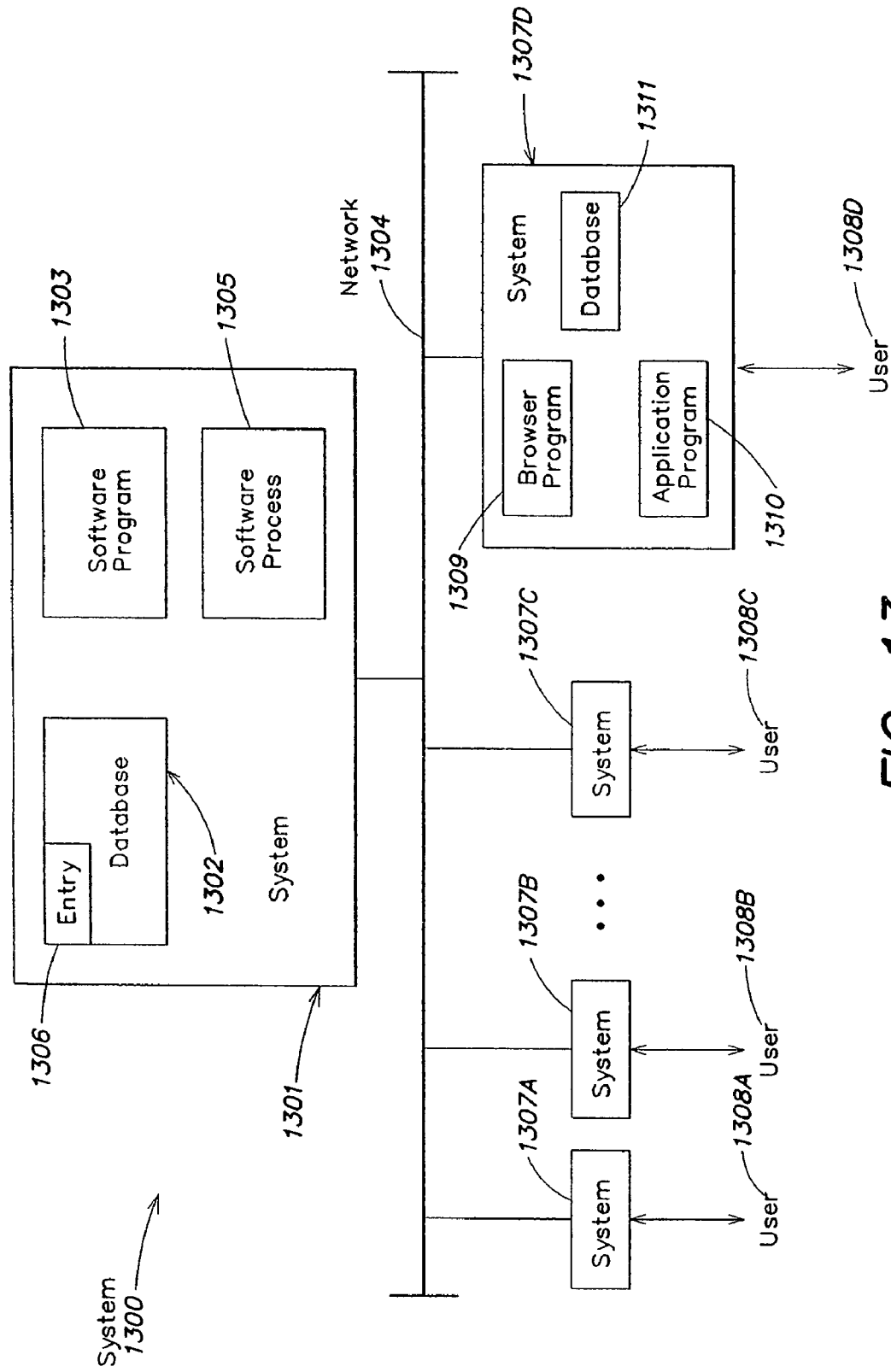
FIG. 13 is a block diagram of a test system architecture according to another embodiment of the present invention.

FIG. 13 shows an architecture diagram of an example system 1300 according to one embodiment of the invention that includes a server that executes test functions, and one or more client systems that render user interfaces used to perform test functions. It should appreciated that FIG. 13 is used for illustration purposes only, and that other architectures may be used to facilitate one or more aspects of the present invention.

As shown in FIG. 13, a computer system 200 (e.g., a general-purpose computer system as described above with reference to FIG. 12) may be used to implement a test system. Computer system 1301 may include one or more software processes 1305 that perform test system functions, database functions, and interface functions as discussed below. According to one embodiment of the present invention, system 1301 may be a general-purpose computer system as discussed above with reference to FIG. 12. To this end, system 1301 may include an operating system, one or more processors, and one or more I/O components.

According to one embodiment, system 1301 permits one or more client systems (e.g., systems 1307A-1307D) and their associated users (e.g., users 1308A-1308D) to access test functions. According to one embodiment, the test system 1301 and its associated hardware and software are communicated with via one or more communication networks 1304. Network 1304 may include, for instance, the Internet, a corporate enterprise network or other communication network type. Notably, users can access test system functions at disparate locations through communication network 1304.

In one embodiment, the test system user interface is a web-based interface, capable of being downloaded and viewed over a communication network. In one embodiment, a client (e.g., client 1307D) includes a browser program (e.g., the Microsoft Internet Explorer browser program). The user may log into test system 1301, and system 1301 may provide one or more software programs or components 1303 that may be used by a client to access test system functions. According to one embodiment, test system functions are performed using the well known Windows forms interface available from the Microsoft Corporation, and may be accessible through a browser program (e.g., 1309). Indeed, the client may download and store any application program 1310 software and/or database elements (e.g., elements stored in database 1311) to render the user interfaces discussed. However, although Windows forms may be used, it should be appreciated that any type of software and/or communication methods may be used (e.g., CGI, Perl, XML, etc.), and the invention is not limited to any particular method.

Notably, the user can, from any web-enabled client, perform test functions. Using web services, for example, a user can control any tester from any location as long as the user has a connection to the test system 1301. Conventionally, user interfaces are tied to and are specific to the testing hardware, and thus are executed locally to the test equipment. According to one embodiment of the present invention, a user logs into the test system 1301 through a communications network (e.g., the Internet).

Further, according to another embodiment, each user is presented their own set of GUIs to control testing. In the case where users perform different functions (programming, maintenance, etc.), the test system 1301 may store different UIs (e.g., as an entry 1306 in database 1302), and depending on the user that logs in, different UIs may be presented to that user. The UIs may include one or more programs (e.g., application program 1310) having one or more locally-stored components. Further, the UIs may include one or more databases in which to store UI configuration data. Thus, the user can view custom UIs at any location having network connectivity, and the custom UIs are tailored to suit the particular role of the user.

Processes in the ATE Tester

Figure 14A:
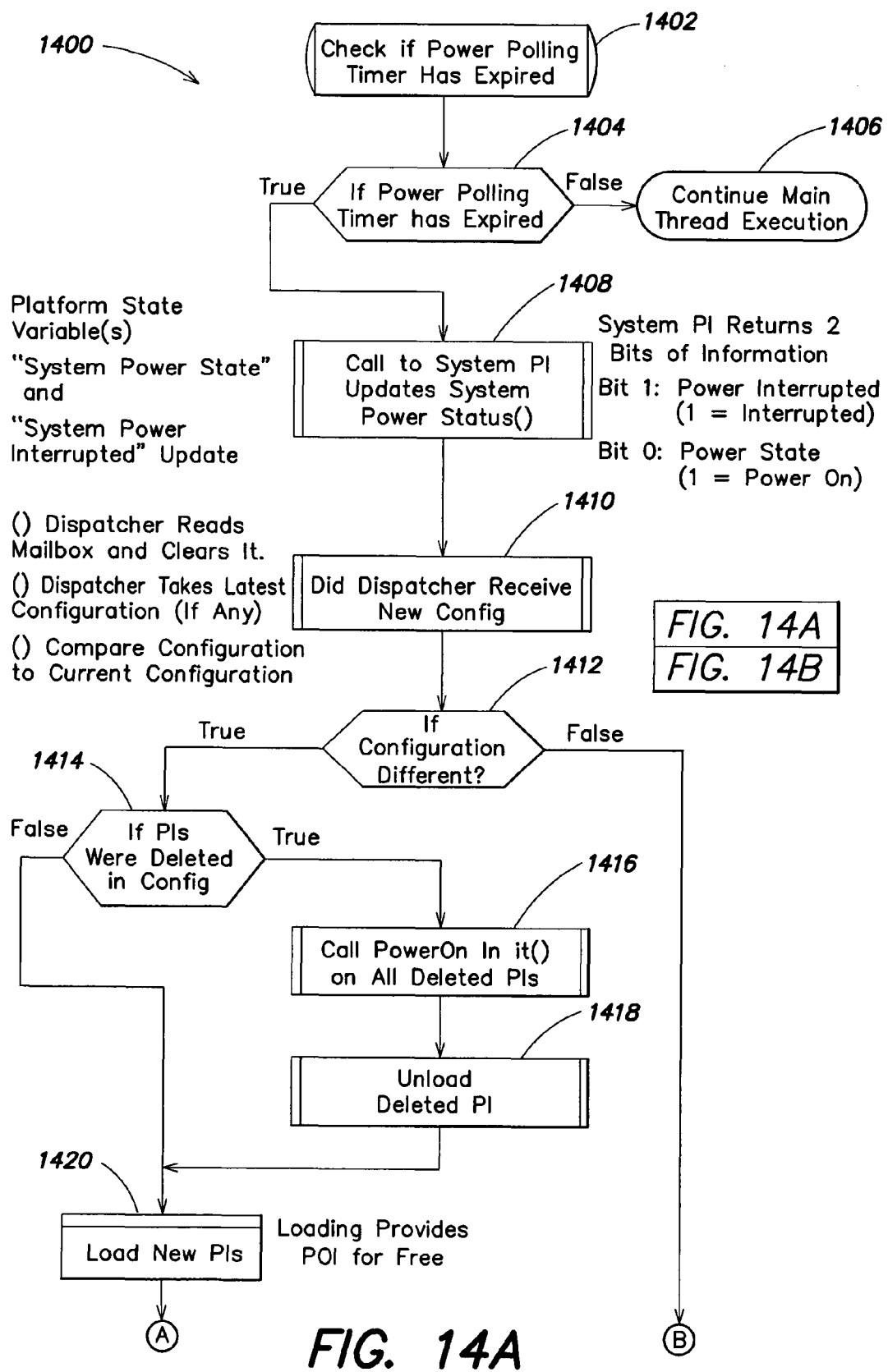
FIG. 14 is a diagram of an example test system process according to one embodiment of the present invention.
Figure 14B:
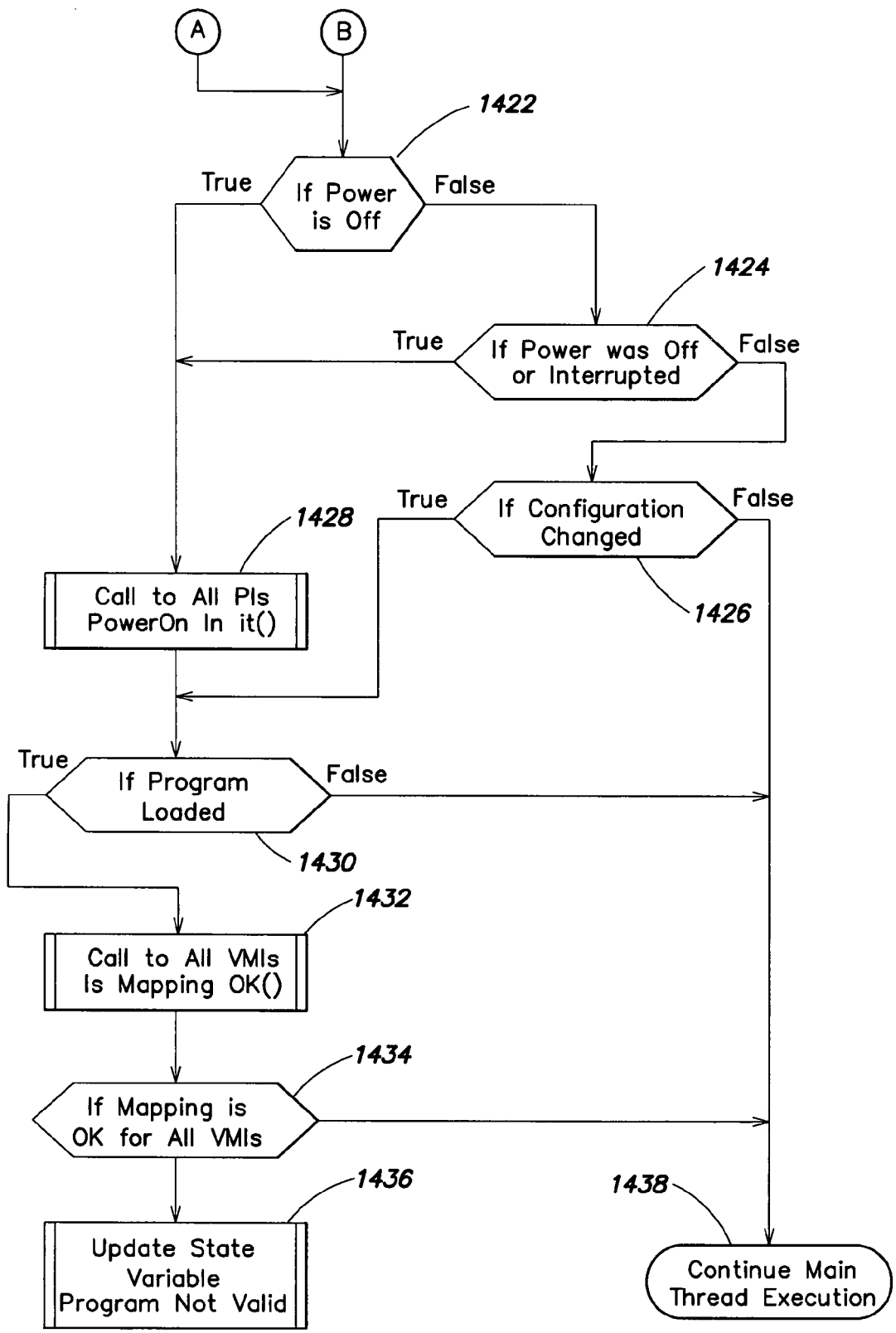

In one embodiment of the present invention, the PowerPoll process, 1400, as shown in FIG. 14, illustrates the interaction between some of the modules within the abstraction layer architecture. The following is an example process that may be performed, for example, using the process flow, 1400, described with respect to FIG. 15. It should be appreciated that the process discussed below is made by way of example only and not by limitation.

The PowerPoll process, 1400, is typically initiated in the platform layer by the expiration of a timer at 1402. Optionally, the PowerPoll process may also check to see if an end of time (EOT) event has occurred or if a program has reached a break point. If the power polling timer has not expired 1404 (FALSE), main thread execution continues at 1406. If the power polling timer has expired, 1404 (TRUE), the platform layer passes a call to the system layer, including two platform state variables "System PowerState" and "System Power Interrupted." In response the system layer through a SystemPI Module calls the Update SystemPowerStatus function, at 1408. In one embodiment, after the entire data flow has been completed the SystemPI will return 2 bits of data to the platform layer; Bit 1: reflecting Power Interrupted & Bit 0: reflecting PowerState. By this abstraction, the platform does not need to know how to actually check the power (e.g., determine the state of a power switch, determine the existence of voltage, etc.), but rather, the SystemPI performs this checking function.

The process flow optionally continues by determining if the platform state variable is at "ProgramAtBreakPoint," (not shown), if not a dispatcher control component reads the mailbox and clears it at step 1410. The dispatcher control component takes the latest configuration (if any) and compares that configuration to the current configuration, at step 1410. Upon determining a different configuration exists 1412 (TRUE), a check is done to determine if PI modules were deleted at 1414, if PI modules were not deleted, 1414 (FALSE) the new PI modules are loaded at 1420, where PI modules were deleted 1414 (TRUE) PowerOnInit function (within the physical instrument layer) is called on all deleted PI modules at 1416 and the deleted PI modules are unloaded at 1418. New PIs are loaded at step 1420. Alternatively, after step 1408's call to SystemPI Update the process may proceed directly to 1410 to determine if dispatcher received new configurations.

The alternative forks of the process 1412 (TRUE) and 1412 (FALSE) meet again and the process determines whether power is available at the hardware represented by the PI modules at 1422. If power is off 1422(FALSE), the PowerOnInit function is called at 1428, if power is available 1422 (TRUE), the system checks to see if power was off or interrupted at 1424. If power was off or interrupted 1424(TRUE) the PowerOnInit function is called at 1428. If power was not off or interrupted 1424(FALSE), the process continues to check if the configuration is different at 1426. The previous forks meet again at the configuration test. If the configuration is not different 1426 (FALSE) the process returns to main thread execution at 1438. If the configuration is different 1426(TRUE) the system will optionally re-qualify and update the platform state variable "StateRecipeQualified." (not shown). Alternatively, in response to the identification of a different configuration 1426(TRUE), a check to determine if the program is loaded is performed at step 1430. If the program is not loaded 1430(FALSE) main thread execution will continue at 1438. If the program is loaded 1430(TRUE) a function call IsMappingOK( ) is made for all VMIs at 1432. If the mapping is ok for all VMIs, 1434(TRUE) main thread execution continues at 1438. If mapping is not ok for all VMIs 1434(FALSE), state variable ProgramNotValid is updated at 1436.

In summary, the exemplary process determines if a system is in a powered on state. Also, if in the powered-on state, the test program and VMIs can successfully meet their requirements to test on the hardware existing post-power-cycle or reconfiguration. The VMI holds the responsibility of this checking, providing another abstraction of responsibility away from the platform and provided to the modules.

Once the power state of a system is determined, the next check is to validate the actual configuration of the system. As a result of this process, configured PI modules with missing or incorrect hardware will put themselves into a disabled state and publish their resources as "PoweredOff." If additional hardware is detected that does not correspond to a configured PI module, then a ValidateConfiguration process (not shown) will publish a warning message. The warning message can be returned to a platform user messaging window or to a platform configurator to display an intelligent display name if available or an "unknown hardware" message if not.

Alarm Processing

Figure 15:
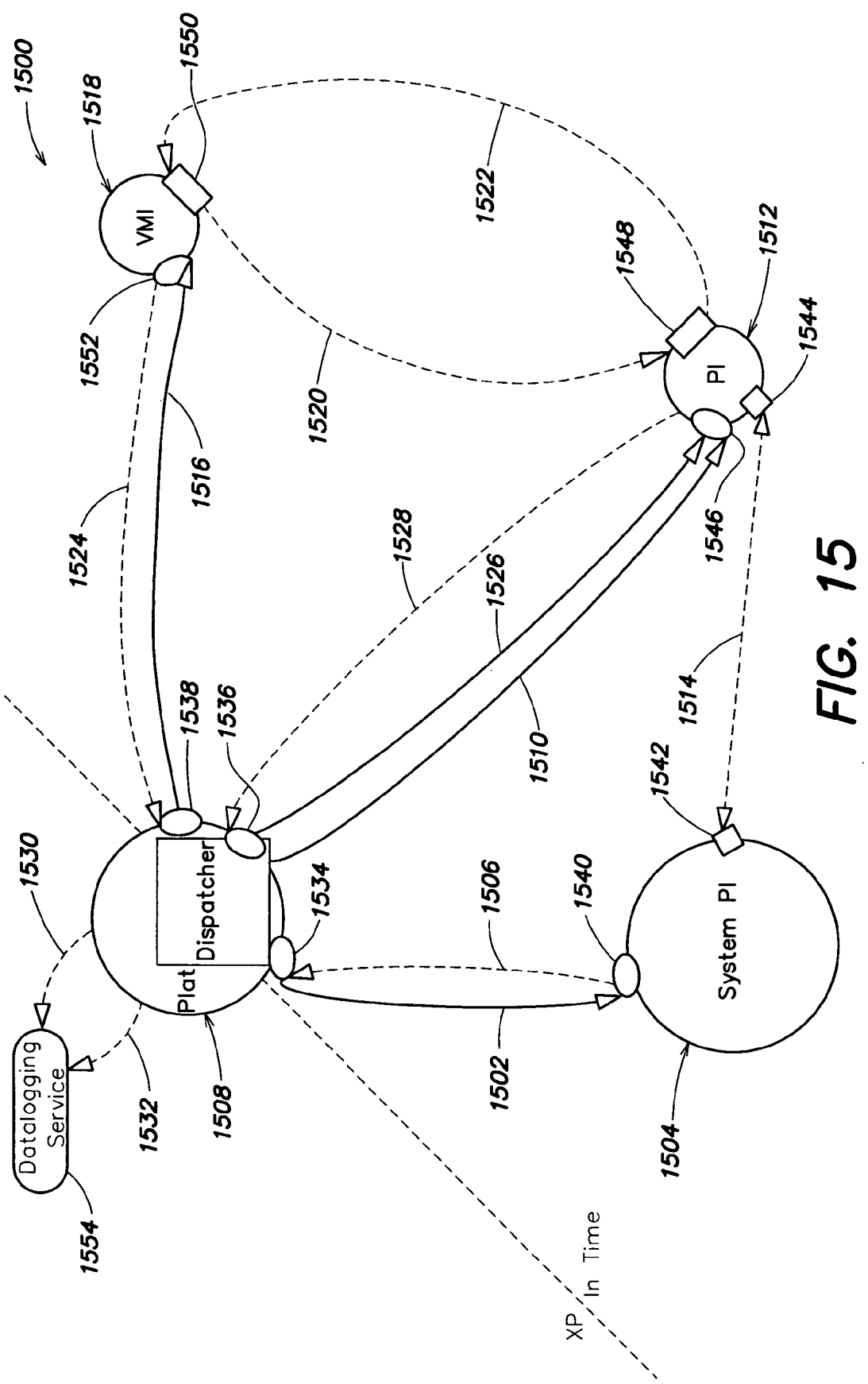
FIG. 15 is a block diagram of an example alarm processing function according to one embodiment of the present invention.

The interaction between the various layers can be further described with respect to FIG. 15 with an illustration of one embodiment's handling of alarm processing. FIG. 15 is presented by way of illustration and not by way of limitation.

As can be seen in the embodiment shown in FIG. 15, the various abstraction layers have been further abstracted into their respective modules. In addition, this example shows at the boundary of each respective module is at least one interface (1534-1552) designed to manage communication between the modules. For instance, the SystemPI 1504 module has an interface 1538 with the platform layer interface 1532 (shown as Platform Software w/Dispatcher) that manages the bi-directional communication with respect to the CheckAlarms function call. In this example, the SystemPI module 1504 also has an interface 1540 for managing communication and functions with the PI module's interface 1542.

In another aspect of the present invention, the platform layer represents an abstraction of the functionality employed to log the results of a process flow. As can be seen with reference to FIG. 15, in one embodiment various function calls performed as part of a process flow report their results to the platform layer. In one embodiment, the platform layer represents an abstraction of the functionality employed to log the reported results of the various function calls from the other abstraction layers.

The various function calls and functionality is described with reference to exemplary alarm process 1500. Exemplary process 1500 is presented by way of illustration and not by limitation. Alarm process 1500 begins with a CheckAlarms( ) call at 1502 to the SystemPI. In one embodiment, the SystemPI 1504 has full knowledge of the configuration of the tester and holds a list of all occupied locations (location is a platform concept and may be represented by a 32-bit number acting as an index into a list). The Platform/dispatcher 1508 expects a return of a list of Locations form the SystemPI 1504 which may have alarmed. At 1506, the SystemPI returns a list containing locations that may have alarmed to the Platform/dispatcher 1508. In one embodiment, this list may be filtered by the SystemPI 1504. In one example, filtering is done based on the SystemPI's 1504 ability to determine is a PI 1512 is under its purview. In another example the system is configured to return PIs 1512 that are not within a SystemPI's 1504 purview automatically. To illustrate, a Ceres Native Instrument is within the purview of the Ceres SystemPI.

A key concept here is that instruments which are not native to a tester can be easily integrated into an overall test solution—the platforms' interface with the PI module has no expectations of hardware implementation. Therefore, in one specific example, a GPIB or PCIExpress-based solution can be integrated exactly as a native-built solution allowing for a hardware-independent solution.

At 1510, the ServiceAlarms( ) call is made to each location returned in the CheckAlarms( ) call to the SystemPI (1502 & 1506). The ServiceAlarms( ) is received and the PI 1512 (or alternatively the SystemPI 1504 (not shown)) accesses its hardware to determine whether an actual alarm state exists. In one embodiment, filtering of alarms by the SystemPI aids in execution time, assisting in maintaining the deterministic nature of the test platform. In another embodiment, the system is configured to not generate Alarms that are not relevant to the accuracy of a measurement or do not indicate that the hardware is in an invalid state. The PI 1512 (alternatively the SystemPI 1504 (not shown)) reads back the alarm state of the hardware at 1514. Step 1514 may also include clearing local alarm cache(s), and may include placing hardware into a safe state.

On reading back the alarm state, the PI 1512 (alternatively the SystemPI 1504 (not shown)) caches alarms by resource, as well as AllSite alarms (global alarms). In one embodiment the cache is maintained until the next ServiceAlarms( ) call is made. Caching enables alarms to be available for tool display.

At 1516, the ReportAlarms( ) call is made to each instantiated VMI 1518. In one embodiment, this call is made independent of whether any locations were returned in the CheckAlarms( ) call to the SystemPI 1504 at 1502 and 1506. According to one example, independent calls to ReportAlarms( ) is beneficial because it accounts for alarms treated as persistent by a PI (e.g. 1512) and when the hardware may not indicate an Alarm to the SystemPI 1504 (this may occur in embodiments where the SystemPI filters alarms based on PIs within its purview) or because a software-level alarm may have occurred either in the VMI or with the VMI's mapped resources. The VMI 1518 queries each of its resources, for example PI 1512 at 1520, to determine if an alarm exists. It should be understood that VMI 1518 may have one or more PIs with which it interacts, and figure should not be interpreted as limiting a VMI to any number of PI interactions and their associated resources.

In response to the VMI query PI 1512 responds with the requested alarm information at 1522 and marks the alarm as reported. PI 1512 may filter out alarms reported back based on design or based on configurations of the PI 1512. In addition VMI 1518 may also filter reported alarms based on design or based on configuration of the VMI 1518. The VMI 1518 provides a response regarding its resources with a ms_bool at 1524. In one embodiment, a response is performed with a bool which is multisite deep. That is, multisite objects (e.g., ms_bool, ms_float, etc) may be created which are sized by the number of sites the program is developed to support. VMI 1518 may compile alarms by site as VMI object may be designed with comprehension of site. The response from ReportAlarms is reported to the Datalogging service 1554 at 1530. Alternatively, the response from ReportAlarms may be combined with other information and reported to the Datalogging service 1554.

GetUnreportedAlarms( ) call is made at 1526 to each instantiated PI 1512 (shown is one PI, however many PIs are possible) and the SystemPI 1054. The GetUnreportedAlarms( ) call may be made independent of whether any locations were returned in the CheckAlarms( ) call (1502 and 1506) and alternatively to the SystemPI 1504 (not shown). In one embodiment, the GetUnReportedAlarms( ) call is only made to the SystemPI and the PIs. The GetUnReportedAlarms( ) call allows for reporting of Alarms by resources which are not mapped to a VMI—the ReportAlarms( ) call to the VMI may be adapted to handle all the alarms for resources mapped to the VMI, whether they are persistent or non-persistent. Persistent alarms or Software Alarms are handled by the fact that even if the SystemPI returns a empty Location List to the CheckAlarms( ) call—the ReportAlarms and GetUnreportedAlarms are still carried out.

In one embodiment, PI 1512 returns a 2-bit number in response at 1526 where the MSB indicates an AllSites Alarm and the LSB indicates and unreported resource alarm. The response from GetUnreportedAlarms( ) reported to the Datalogging Service 1554 at 1532. Alternatively, the response may be combined with other information and reported to the Datalogging service 1554, for example the response from ReportAlarms and GetUnreportedAlarms may be combined and sent together to Datalogging service 1554.

PowerOnIntitialize (POI) Function

In one embodiment of the present invention, the physical instrument layer calls a PowerOnInitialize function as part of the system process that polls a system's power state. In one embodiment of the present invention, the PowerOnInitialize function is included in a physical instrument base class of methods. According to one aspect of the invention, the PowerOnInitialize function is designed to place a PI module and its hardware into an known initial power state. According to another aspect of the invention, it is important that the test hardware powers into a known safe state because there is no guarantee that the platform layer is running or that a PI module is configured and loaded. In one embodiment, the PowerOnInitialize function is a member of a base class of functions defined in the physical instrument abstraction layer.

Figure 16:
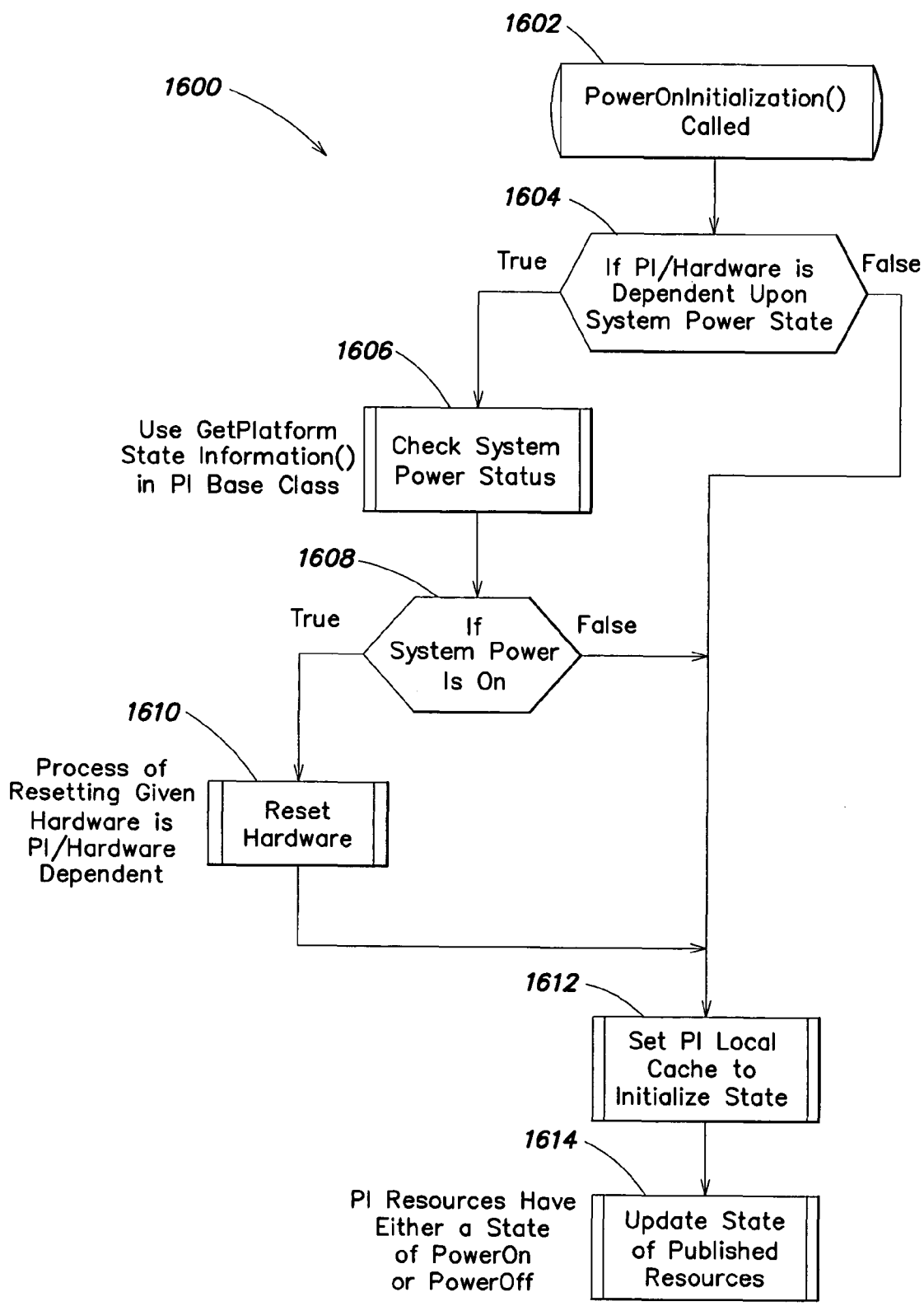
FIG. 16 is a flow diagram of an example power initialize function according to one embodiment of the present invention.

FIG. 16 shows an example illustration of one embodiment's implementation of the PowerOnInitialize function, 1600. FIG. 16 describes an exemplary data flow, and should not be read to limit the present invention either to the one function illustrated or this particular data flow.

PowerOnInitialization( ) call is made at 1602. At 1604 a determination is made whether the PI/Hardware device is dependent upon its system power state in order to perform its test functions. If it is not 1604(FALSE) then the PI local cache is set to initialized state at 1612 and state of published resources is updated at 1614. If a PI/Hardware device is dependent upon system power state 1604(TRUE) then a power status check for the system is performed at 1606. In one embodiment a GetPlatformStateInformation( ) call is made to obtain the system power status. In another embodiment the GetPlatformStateInformation( ) call is part of the PI Base Class of functions. If the system power is not on 1608 (FALSE) then the PI local cache is set to initialized state at 1612 and state of published resources is updated at 1614. If the system power in on 1608 (TRUE) that PI/hardware device is reset. In one embodiment, resetting is performed to guaranty the PI/hardware device is in a known state for testing. Once the PI/hardware device is reset the PI local cache is set to initialized state at 1612 and state of published resources is updated at 1614. In one embodiment PI resources have either a State of PowerOn or PowerOff to identify their power state.

In another embodiment, the virtual instrument layer includes a base class of functions that define basic functionality employed to perform its functions. In one example, a VI module calls the GetPlaformInformation function to get platform state information. In one embodiment, the virtual instrument layer includes a function for reporting a list of alarms against its resources. In another embodiment, the alarm reporting function is included in the base class of functions.

According to another aspect of the present invention, the system layer includes a base class of functions that define basic functionality employed to perform its functions. In one example, the platform calls the UpdateSystemPowerStatus function as part of the PowerPoll process shown in FIG. 14. In embodiment, the UpdateSystemPowerStatus function is included in the system layer base class of functions. In another example, the base class of functions includes a CheckAlarm function, adapted to check whether locations have alarms returning a list of alarms.

Software Wizards and Rules Checking Engines

According to one aspect of the invention, the abstraction of functionality includes abstracting the functionality employed to operate software wizards adapted to generate interfaces between the various abstraction layers. In one embodiment, the abstraction of functionality includes an interface generation engine adapted to generate interfaces that manage communication between the various abstraction layers. In one embodiment, the interface generation engine represents the abstraction of the functionality employed to define an interface between a module in the system layer and a module in the physical instrument layer. In one embodiment, the interface generation engine represents the abstraction of the functionality employed to define an interface between a module in the virtual instrument layer and a module in the physical instrument layer. In one embodiment, the interface generation engine represents the abstraction of the functionality employed to define an interface between a module in the virtual instrument layer and a module in the system layer. In another embodiment, the interface generation engine represents the abstraction of the functionality employed to define an interface between a SystemPI module, PI Module, VI Module and the platform layer.

In another embodiment, the abstraction of functionality includes abstraction of the functionality employed to operate software wizards adapted to generate modules of the various abstraction layers. In one embodiment, the abstraction of functionality includes a module generation engine adapted to define a module in one of the abstraction layers. In one embodiment, the module generation engine represents the abstraction of the functionality employed to define a VI module. In another embodiment, the module generation engine represents the abstraction of the functionality employed to define a PI module. In another embodiment, the module generation engine represents the abstraction of the functionality employed to define a SystemPI module. In another embodiment, the module generation engine may represent the abstraction of the functionality employed to define a platform module.

According to one aspect of the present invention, the generated modules need to be verified to insure appropriate mapping between the various abstraction layers. According to another aspect of the present invention, generated modules must be verified to insure appropriate functionality. In one embodiment, a rules checking engine represents an abstraction of the functionality employed to verify the appropriate mapping of generated modules and to insure appropriate functionality. For instance, in one implementation, the SystemPI and PI perform rule checking to verify that they can work with each without adverse interaction. The VMI may perform rule checking to verify that the mapping of resources to it maintains needed rules to function correctly.

It should be appreciated that the invention is not limited to each of the embodiments listed above and described herein, but rather, various embodiments of the invention may be practiced alone or in combination with other embodiments.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An automated test equipment system comprising:
 a platform abstraction layer adapted to manage the operation of abstraction layers of the automated test equipment system;
 a physical instrument ("PI") abstraction layer adapted to map PI function calls to hardware so that the hardware performs a function in response to a PI function call;
 a virtual instrument ("VI") abstraction layer adapted to map to the PI abstraction layer so that the VI abstraction layer represents a virtualization of hardware functions that may be performed;
 a system abstraction layer adapted to map system function calls to enable the hardware to perform functions in response to PI function calls; and
 a test program abstraction layer adapted to interact with the virtual instrument layer to initiate functions performed on hardware.

2. The automated test equipment system of claim 1, wherein the system abstraction layer is further abstracted into a system physical instrument ("SystemPI") module that receives requests from the PI abstraction layer and causes hardware to perform its function in response.

3. The automated test equipment system of claim 2, wherein the SystemPI module is further adapted to aggregate information reported by the other abstraction layers of the automated test equipment system.

4. The automated test equipment system of claim 3, wherein the information aggregated includes success or failure of function calls made in the other abstraction layers of the automated test equipment system.

5. The automated test equipment system of claim 3, wherein the information aggregated includes reporting by operations in the other abstraction layers of the automated test equipment system.

6. The automated test equipment system of claim 3, wherein SystemPI module is further adapted to accept queries on the information aggregated.

7. The automated test equipment system of claim 3, wherein SystemPI module is further adapted to report on the information aggregated.

8. The automated test equipment system of claim 1, wherein the test program abstraction layer includes a test program adapted to present a graphical user interface to a user.

9. The automated test equipment system of claim 8, wherein the test program layer is further adapted to permit a user to interact with the virtual instrument layer.

10. The automated test equipment system of claim 9, wherein the test program layer is further adapted to permit a user to define tests to be performed on a device.

11. The automated test equipment system of claim 10, wherein the test program is further adapted to graphically render the results of performed tests.

12. The automated test equipment system of claim 10, wherein the test program layer is further adapted to permit a user to define tests to be performed on a device, wherein the tests to be performed occur at a scheduled time.

13. The automated test equipment system of claim 12, wherein tests to be performed can occur on any user defined schedule.

14. The automated test equipment system of claim 1, wherein the virtual instrument abstraction layer includes a VI module, wherein the VI module includes a mapping to at least one hardware resource.

15. The automated test equipment system of claim 14, wherein the VI module is adapted to cause the at least one hardware resource to perform its function in response to requests.

16. The automated test equipment system of claim 15, wherein the VI module causes the at least one hardware resource to perform its function in response to a request from the test program abstraction layer.

17. The automated test equipment system of claim 14, wherein the mapping to the at least one hardware resource is mapped through the PI instrument layer.

18. The automated test equipment system of claim 14, wherein the mapping to the at least one hardware resource is mapped through a PI module.

19. The automated test equipment system of claim 18, wherein the mapping between the VI Module and the PI module is managed by an interface.

20. The automated test equipment system of claim 19, wherein the interface is a graphical user interface.

21. The automated test equipment system of claim 19, wherein the interface manages communication between the VI Module and the PI module in a predetermined format.

22. The automated test equipment system of claim 14, wherein the VI module is mapped to a plurality of PI modules so that the VI module renders a virtual representation of a plurality of hardware resources employed to test a device.

23. The automated test equipment system of claim 14, wherein the VI module is adapted to be modified to include a mapping to an additional PI module.

24. The automated test equipment system of claim 14, wherein the VI module is adapted to include a base class of functions that map to test hardware resources necessary for any ATE tester.

25. The automated test equipment system of claim 1, wherein the physical instrument abstraction layer includes a PI module that contains the implementation details of a hardware resource.

26. The automated test equipment system of claim 25, wherein the physical instrument abstraction layer includes a PI module that contains the implementation details of each hardware resource.

27. The automated test equipment system of claim 25, wherein the physical instrument abstraction layer is adapted incorporate the implementation details of a new hardware resource.

28. The automated test equipment system of claim 27, wherein the new hardware resource is mapped to by a new PI module.

29. The automated test equipment system of claim 25, wherein the PI module causes execution of the hardware resource's functionality in response to requests.

30. The automated test equipment system of claim 29, wherein the request comes from a VI module.

31. The automated test equipment system of claim 29, wherein the hardware resource's functionality includes a synchronization signal.

32. The automated test equipment system of claim 25, wherein the physical instrument module includes a function call that will cause a hardware resource to power on and/or initialize.

33. The automated test equipment system of claim 32, wherein the function call includes the PowerOnInitialize function.

34. The automated test equipment system of claim 1, wherein the PI abstraction layer includes a base class of PI function calls.

35. The automated test equipment system of claim 34, wherein the base class of PI function calls includes the function call adapted to cause a hardware resource to power on and/or initialize.

36. The automated test equipment system of claim 35, wherein the function call adapted to cause a hardware resource to power on and/or initialize includes the PowerOnInitialize function.

37. The automated test equipment system of claim 1, wherein the platform abstraction layer includes an "off the shelf" operating system.

38. The automated test equipment system according to claim 37, wherein the "off the shelf" operating system is enhanced to perform deterministically.

39. The automated test equipment system according to claim 37, wherein the "off the shelf" operating system is Windows XP.

40. The automated test equipment system according to claim 39, wherein the operating system is enhanced to perform deterministically using real-time extensions.

41. The automated test equipment system according to claim 40, wherein the real-time extensions are provided through the "Tenasys INtime" operating system.

42. The automated test equipment system of claim 1, wherein the platform abstraction layer operates deterministically.

43. The automated test equipment system of claim 1, further comprising an interface abstraction layer adapted to manage the communication between the abstraction layers.

44. The automated test equipment system of claim 43, wherein the interface abstraction layer is further adapted to insure standardized communication between the abstraction layers.

45. The automated test equipment system of claim 44, wherein the interface abstraction layer includes a interface between the platform abstraction layer and the VI abstraction layer.

46. The automated test equipment system of claim 44, wherein the interface abstraction layer includes a interface between the platform abstraction layer and the system abstraction layer.

47. The automated test equipment system of claim 44, wherein the interface abstraction layer includes a interface between the platform abstraction layer and the physical instrument abstraction layer.

48. The automated test equipment system of claim 44, wherein the interface abstraction layer includes a interface between a VI module and a PI module.

49. The automated test equipment system of claim 44, wherein the interface abstraction layer includes an interface between a SystemPI module and a VI module.

50. The automated test equipment system of claim 44, wherein the interface abstraction layer includes an interface between a SystemPI module and a PI module.

51. The automated test equipment system of claim 44, wherein the interface abstraction layer includes a interface between the platform abstraction layer and the VI abstraction layer.

52. The automated test system of claim 1, further comprising: a module generation engine adapted to guide a user through the creation of one of a PI module and a VI module so that the automated test system is capable incorporating new test hardware resources.

53. The automated test system of claim 1, further comprising an interface generation engine adapted to guide a user through the creation of an interface, wherein the interface will manage communication between modules by standardizing the format of communication without consideration of the hardware, software or platform being employed on the automated test system.

54. The automated test system of claim 53, further comprising a rule checking engine adapted to verify the test functionality of a generated module and its generated interface.

55. The automated test system of claim 54, further comprising an installation module adapted to permit a user to install the generated module so that the test program could direct requests to the generated module and have test functions performed.

56. The automated test system of claim 55, further comprising an installation module adapted to permit a user to install the generated interface so that the test program may direct requests to the test hardware resources mapped to by the generated module and have test functions performed.

* * * * *